(12) United States Patent
Tanaka

(10) Patent No.: US 7,834,413 B2
(45) Date of Patent: Nov. 16, 2010

(54) SEMICONDUCTOR PHOTODETECTOR AND METHOD OF MANUFACTURING THE SAME

(75) Inventor: Akimasa Tanaka, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 809 days.

(21) Appl. No.: 10/581,081

(22) PCT Filed: Nov. 30, 2004

(86) PCT No.: PCT/JP2004/017798

§ 371 (c)(1),
(2), (4) Date: Apr. 6, 2007

(87) PCT Pub. No.: WO2005/055327

PCT Pub. Date: Jun. 16, 2005

(65) Prior Publication Data

US 2007/0284685 A1    Dec. 13, 2007

(30) Foreign Application Priority Data

Dec. 4, 2003    (JP) .......................... P2003-406396

(51) Int. Cl.
*H01L 31/0224* (2006.01)
(52) U.S. Cl. ..................... 257/466; 257/459; 257/448; 257/E31.124
(58) Field of Classification Search ................ 257/447, 257/448, 452, 459, 460, 465, 466, E31.124, 257/E31.032
See application file for complete search history.

(56) References Cited

U.S. PATENT DOCUMENTS 4,683,163 A * 7/1987 Jarry et al. ................. 428/209
5,852,322 A * 12/1998 Speckbacher ............... 257/459

FOREIGN PATENT DOCUMENTS

| JP | 60-101929 | 6/1985 |
|----|-----------|--------|
| JP | 63-161680 | 7/1988 |
| JP | 3-104287 | 5/1991 |
| JP | 5-37004 | 2/1993 |
| JP | 5-95130 | 4/1993 |
| JP | 5-102513 | 4/1993 |
| JP | 5-152551 | 6/1993 |
| JP | 5-267708 | 10/1993 |
| JP | 5-291604 | 11/1993 |
| JP | 6-77518 | 3/1994 |
| JP | 6-296035 | 10/1994 |
| JP | 6-326293 | 11/1994 |
| JP | 10-335624 | 12/1998 |
| JP | 2002-231992 | 8/2002 |
| JP | 2002-353564 | 12/2002 |

* cited by examiner

*Primary Examiner*—Jerome Jackson, Jr.
*Assistant Examiner*—Yu Chen
(74) *Attorney, Agent, or Firm*—Drinker Biddle & Reath LLP

(57) ABSTRACT

The present invention relates to a semiconductor photodetector and the like that can be made adequately compact while maintaining mechanical strength. The semiconductor photodetector includes a structural body of layers and a glass substrate. The structural body of layers is arranged from an antireflection film, a high-concentration carrier layer of an n-type (first conductive type), a light absorbing layer of the n-type, and a cap layer of the n-type that are laminated successively. The glass substrate is adhered via a silicon oxide film onto the antireflection film side of the structural body of layers. The glass substrate is optically transparent to incident light.

8 Claims, 19 Drawing Sheets

SEMICONDUCTOR PHOTODETECTOR AND METHOD OF MANUFACTURING THE SAME

TECHNICAL FIELD

The present invention relates to a semiconductor photodetector, in particular, a back-illuminated semiconductor photodetector and a method of manufacturing this semiconductor photodetector.

BACKGROUND ART

With recent increases in the driving frequencies of CPUs (for example, up to 10 GHz or more), optical interconnection arts, for transmitting signals within a system device or among devices by the sending and receiving of light, have come to be noted. Optical semiconductor devices, such as semiconductor photodetectors and semiconductor light emitting devices, are used in such optical interconnection arts.

Among semiconductor photodetectors, there are known back-illuminated semiconductor photodetectors, which have a semiconductor substrate and with which a plurality of compound semiconductor layers are formed on a back surface that opposes a light-incident surface of the semiconductor substrate (see, for example, Patent Documents 1 to 3). With the semiconductor photodetectors described in these Patent Documents 1 to 3, a substrate portion corresponding to a photosensitive portion is thinned partially and a thick portion is formed so as to surround this substrate portion for the following reasons. A first reason is to prevent optical signal degradation or extinction due to light absorption by the semiconductor photodetector from becoming damaged or broken when the semiconductor photodetector is mounted by wire bonding or bump bonding onto an external substrate, etc.

Patent Document 1: Japanese Patent Application Laid-Open No. H3-104287

Patent Document 2: Japanese Patent Application Laid-Open No. H6-296035

Patent Document 3: Japanese Patent, Application Laid-Open No. 2002-353564

DISCLOSURE OF THE INVENTION

Problem to be Solved by the Invention

The inventors found the following issues as a result of examining conventional semiconductor photodetectors. That is, with each of the semiconductor photodetectors described in the above-mentioned Patent Documents 1 to 3, there is a limit to making the semiconductor photodetector small due to the presence of the thick portion at the periphery of the thinned substrate portion. In particular, in forming an array of semiconductor photodetectors, the device size becomes inevitably large since a narrow pitch is difficult to realize (the making of the semiconductor photodetector compact is difficult).

The present invention has been to made resolve the above issue, and an object thereof is to provide a semiconductor photodetector that can be made adequately compact while maintaining mechanical strength and a method of manufacturing such a semiconductor photodetector.

Means for Solving Problem

A semiconductor photodetector according to the present invention is a semiconductor photodetector in which a plurality of compound semiconductor layers are laminated. On a light-incident surface side of such a structural body of layers that has the plurality of compound semiconductor layers, a glass substrate that is optically transparent to incident light is adhered via a silicon oxide film.

In the semiconductor photodetector according to the present invention, even when the plurality of compound semiconductor layers included in the structural body of layers are formed as thin films, the mechanical strength of the structural body of layers is maintained by the glass substrate. Additionally, in this semiconductor photodetector, a thick portion does not need to be formed at a periphery of a thinned substrate portion that corresponds to being a photosensitive portion as in the semiconductor photodetector described in the above-mentioned Patent Documents 1 to 3, and the device can be made compact readily.

Also, in the semiconductor photodetector according to the present invention, the glass substrate is adhered via the silicon oxide film onto the structural body of layers, and the structural body of layers and the glass substrate can thus be adhered without using an adhesive agent, etc. Light that is made incident from the glass substrate side can thus reach the film structure without being absorbed by the adhesive agent, etc.

In the semiconductor photodetector according to the present invention, the structural body of layers includes a high-concentration carrier layer of a first conductive type, a light absorbing layer of the first conductive type, and a cap layer of the first conductive type that are laminated in that order from the light-incident surface side as the plurality of compound semiconductor layers. Preferably, a photosensitive region of a second conductive type is formed on at least the cap layer, and the silicon oxide film is formed on the high-concentration carrier layer side of the structural body of layers.

In the semiconductor photodetector according to the present invention, it is preferable that the structural body of layers further includes an antireflection film disposed between the silicon oxide film and the high-concentration carrier layer. In this case, the reflection of the light that is about to become incident on the photosensitive region is prevented and the amount of light incident on the light absorbing layer increases, thereby improving the photosensitivity.

The semiconductor photodetector according to the present invention may further have a light reflecting film disposed on the cap layer side of the structural body of layers so as to cover the photosensitive region. In this case, since light that has passed once through the light absorbing layer without being absorbed is reflected by the light reflecting film and is made incident on the light absorbing layer again (the probability of absorption at the light absorbing layer is improved), the photosensitivity is improved further.

The plurality of compound semiconductor layers are arranged as a photosensitive portion, a first pad electrode positioning portion adjacent to the photosensitive portion, and a second pad electrode positioning portion disposed so as to sandwich the photosensitive portion together with the first pad electrode positioning portion. The photosensitive portion is a region shaped to a mesa form in a state of including a part of the cap layer, including a periphery of the photosensitive region, a part of the light absorbing layer adjacent to the part of the cap layer, and a part of the high-concentration carrier layer adjacent to the part of the light absorbing layer. The first pad electrode positioning portion is a region shaped to a mesa form in a state of including a part of the cap layer, a part of the light absorbing layer, and a part of the high-concentration carrier layer. The second pad electrode positioning portion is a region shaped to a mesa form in a state of including a part of the cap layer, a part of the light absorbing layer, and a part of the high-concentration carrier layer. The photosensitive portion has a depression that reaches the high-concentration carrier layer. In this arrangement, it is preferable that the semiconductor photodetector further includes a first pad electrode, positioned on the first pad electrode positioning portion, a first wiring electrode, electrically connecting the first pad electrode to the photosensitive region, a second pad electrode, positioned at the second pad electrode positioning portion, and a second wiring electrode, electrically connecting the second pad electrode to the high-concentration carrier layer of the photosensitive portion. The first wiring electrode is formed so that a portion thereof extends along side surfaces of the photosensitive portion and the first pad electrode positioning portion, from the photosensitive portion to the first pad electrode positioning portion. The second wiring electrode is formed so that a portion thereof extends along side surfaces of the depression, the photosensitive portion, and the second pad electrode positioning portion, from the depression of the photosensitive portion to the second pad electrode positioning portion.

Since the first pad electrode positioning portion, the photosensitive portion, and the second pad electrode positioning portion are mutually separated as described above, the parasitic capacitance can be reduced further. Also, the depression that reaches the high-concentration carrier layer is formed in the photosensitive portion, and the high-concentration carrier layer of the photosensitive portion and the second pad electrode are electrically connected by the second wiring electrode via the depression. Since the electrode is thus lead out directly from the high-concentration carrier layer of the photosensitive portion, the series resistance can be reduced significantly. Due to the above, a semiconductor photodetector of excellent, high-speed response characteristics is realized.

In the above arrangement, since each of the first and the second pad electrode positioning portions includes a part of the high-concentration carrier layer, a part of the light absorbing layer, and a part of the cap layer, the first pad electrode and the second pad electrode can readily be positioned at substantially the same height. The mounting of the semiconductor photodetector by bump bonding can also be realized thereby.

Also, since not only the first pad electrode positioning portion but the second pad electrode positioning portion is also separated from the photosensitive portion, the interval between the photosensitive portion and the first pad electrode and the interval between the photosensitive portion and the second pad electrode become comparatively wide. However, since the electrodes are lead out directly from the high-concentration carrier layer of the photosensitive portion as mentioned above, the series resistances are reduced significantly even if the wiring lengths become long.

In the semiconductor photodetector according to the present invention, it is preferable that the depression is shaped to a groove-like form so as to surround the photosensitive region. In this case, the area of connection of the high-concentration carrier layer of the photosensitive portion and the second wiring electrode becomes large and the series resistance is reduced further.

Bump electrodes may be positioned at the first pad electrode and the second pad electrode. In this case, the semiconductor photodetector can be mounted without increasing the wiring resistance.

The semiconductor photodetector according to the present invention may have one or a plurality of photosensitive sections each having the same structure as the above-mentioned photosensitive portion, and in this case the photosensitive portions are aligned in an array form.

A lens portion, which condenses the incident light, may be formed on the glass substrate. In this case, even when the photosensitive region is small compared to the illumination range of the incident light, the incident light can be collected efficiently. The lens portion is preferably formed more towards the structural body of layers side than an outermost surface at the opposite side of the glass substrate surface that faces the structural body of layers. In this case, the glass substrate having the lens portion formed thereon can be adhered readily. Also, since the lens portion is processed prior to adhesion, restrictions are not placed in the processing method, etc., and the degree of freedom of design of the lens shape, etc., is increased.

A semiconductor photodetector manufacturing method according to the present invention comprises at least: a first step of preparing a semiconductor substrate and a glass substrate that is optically transparent to incident light; a second step of forming a structural body of layers, including a plurality of compound semiconductor layers, on one surface of the semiconductor substrate; a third step of forming a silicon oxide film on an opposite side of the semiconductor substrate across the structural body of layers; a fourth step of adhering the glass substrate onto the structural body of layers via the silicon oxide film so that the silicon oxide film contacts one surface of the glass substrate; and a fifth step, as a step carried out after the fourth step, of removing the semiconductor substrate that contacts the structural body of layers.

In the manufacturing method according to the present invention, the semiconductor substrate, on which the structural body of layers is formed, and the glass substrate are adhered so that the silicon oxide film, formed on the outermost surface side of the structural body of layers including the plurality of compound semiconductors, contacts the one surface of the glass substrate, and thereafter, the semiconductor substrate is removed. The semiconductor photodetector, with which the glass substrate is adhered onto the light-incident surface side of the structural body of layers via the silicon oxide film, can thus be obtained readily.

In the manufacturing method according to the present invention, since the glass substrate is present even after removal of the semiconductor substrate, the mechanical strength of the structural body of layers is maintained by the glass substrate even if the plurality of compound semiconductor layers included in the structural body of layers are formed as thin films. The semiconductor photodetector obtained by this manufacturing method thus does not require the forming of a thick portion around a thinned substrate portion as is the case with the semiconductor photodetectors of the above-mentioned Patent Documents 1 to 3, and compactness of the device can thus be realized readily. Prior to adhesion of the glass substrate, the mechanical strength of the structural body of layers is maintained by the semiconductor substrate.

In the manufacturing method according to the present invention, since the structural body of layers is adhered via the silicon oxide film onto the glass substrate, the plurality of laminated compound semiconductor layers are adhered onto the glass substrate without the use of an adhesive agent, etc. Light made incident from the glass substrate side can thus reach the plurality of laminated compound semiconductor layers without becoming absorbed by the adhesive agent, etc.

In the fifth step of removing the semiconductor substrate, the semiconductor substrate is preferably removed by wet etching.

It is preferable that the manufacturing method according to the present invention further includes a first sub step, as a step carried out between the first step and the second step, of forming an etching stopping layer that stops the wet etching and is positioned between the semiconductor substrate and the structural body of layers; and a sixth step, as a step carried out after the fifth step, of removing the etching stopping layer by wet etching. In this case, etching of the semiconductor substrate is enabled, and by suitably selecting an etching solution that cannot etch the etching stopping layer and an etching solution that can etch the etching stopping layer but cannot etch the compound semiconductor layer, just the etching stopping layer can be removed after removing the semiconductor substrate. The semiconductor substrate can thereby be removed definitely and readily while leaving the structural body of layers (plurality of compound semiconductor layers).

It is preferable that the manufacturing method according to the present invention further includes a second sub step, as a step carried out between the first sub step and the second step, of forming a protective layer that protects the plurality of compound semiconductor layers from etching solutions and is positioned between the etching stopping layer and the structural body of layers. In this case, the contamination of the structural body of layers (plurality of compound semiconductor layers) by the etching solutions can be prevented definitely.

In addition, in the manufacturing method according to the present invention, the structural body of layers preferably includes a cap layer of a first conductive type, a light absorbing layer of the first conductive type, and a high-concentration carrier layer of the first conductive type that are laminated as the plurality of compound semiconductor layers in that order from the side facing the semiconductor substrate.

The manufacturing method according to the present invention may further include a third sub step, as a step carried out between the second step and the third step, of forming an antireflection film at the opposite side of the semiconductor substrate across the structural body of layers so as to be positioned between the structural body of layers and the silicon oxide film. In this case, since reflection of the light that is about to be made incident on the light absorbing layer is prevented and the amount of light incident on the light absorbing layer increases, the photosensitivity improves.

The manufacturing method according to the present invention may further include: a seventh step, as a step carried out after the fifth step, of forming a photosensitive region of a second conductive type on at least the cap layer; an eight step, as a step carried out after the seventh step, of forming a depression reaching from the cap layer to the high-concentration carrier layer; a ninth step, as a step carried out after the seventh step, of shaping the photosensitive portion, the first pad electrode positioning portion, and the second pad electrode positioning portion, respectively, to mesa forms; a tenth step of forming a first pad electrode on the first pad electrode positioning portion; an eleventh step of forming a second pad electrode on the second pad electrode positioning portion; a twelfth step of forming the first wiring electrode so that a portion thereof extends along side surfaces of the photosensitive portion and the first pad electrode positioning portion from the photosensitive portion to the first pad electrode positioning portion; and a thirteenth step of forming the second wiring electrode so that a portion thereof extends along side surfaces of the depression, the photosensitive portion, and the second pad electrode positioning portion from the depression of the photosensitive portion to the second pad electrode positioning portion.

In this case, since the first pad electrode positioning portion, the photosensitive portion, and the second pad electrode positioning portion are separated, the parasitic capacitance can be reduced further. Also, the depression that reaches the high-concentration carrier layer is formed in the photosensitive portion, and the high-concentration carrier layer of the photosensitive portion and the second pad electrode are electrically connected by the second wiring electrode via the depression. Since the electrode is thus lead out directly from the high-concentration carrier layer of the photosensitive portion, the series resistance can be reduced significantly. Due to the above, a semiconductor photodetector of excellent, high-speed response characteristics is realized.

Also, in the above arrangement, since each of the first pad electrode positioning portion, the photosensitive portion, and the second pad electrode positioning portion includes a part of the high-concentration carrier layer, a part of the light absorbing layer, and a part of the cap layer, the first pad electrode and the second pad electrode can readily be positioned at substantially the same height. The mounting of the semiconductor photodetector by bump bonding is also enabled thereby.

Furthermore, since not only the first pad electrode positioning portion but the second pad electrode positioning portion is also formed so as to be separated from the photosensitive portion, the interval between the photosensitive portion and the first pad electrode and the interval between the photosensitive portion and the second pad electrode become comparatively wide. However, since the electrodes are lead out directly from the high-concentration carrier layer of the photosensitive portion as mentioned above, the series resistances are reduced significantly even when the wiring lengths become long.

The manufacturing method according to the present invention may furthermore comprise a fourteenth step, as a step carried out after the seventh step, of forming a light reflecting film so as to cover the photosensitive region. In this case, since light that has passed through the light absorbing layer without being absorbed is reflected by the light reflecting film and is made incident on the light absorbing layer again (the probability of absorption at the light absorbing layer is improved), the photosensitivity is improved further.

In the manufacturing method according to the present invention, a lens portion, which condenses the incident light, is preferably formed on the glass substrate. In this case, even when the photosensitive region is small compared to the illumination range of the incident light, the incident light can be collected efficiently. The lens portion is preferably formed more towards the structural body of layers side than an outermost surface at the opposite side of the glass substrate surface that faces the structural body of layers. In this case, the glass substrate having the lens portion formed thereon can be adhered readily. Also, since the lens portion is processed prior to adhesion, restrictions are not placed in the processing method, etc., and the degree of freedom of design of the lens shape, etc., is increased.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

EFFECT OF THE INVENTION

In accordance with the present invention, a semiconductor photodetector that can be made adequately compact while maintaining mechanical strength and a method of manufacturing the semiconductor photodetector can be provided.

DESCRIPTION OF THE REFERENCE NUMERALS

1 . . . glass substrate; 1a . . . lens portion; 1b . . . outermost surface; 2 . . . antireflection film; 3 (3a, 3b) . . . high-concentration carrier layer; 5 (5a, 5b) . . . light absorbing layer; 7 (7a, 7b) . . . cap layer; 9 . . . photosensitive region; 10 . . . silicon oxide film; 11 . . . photosensitive portion; 13 . . . depression; 19 . . . passivation film; 21 . . . first pad electrode positioning portion; 23 . . . first pad electrode; 31 . . . second pad electrode positioning portion; 33 . . . second pad electrode; 41 . . . bump electrode; 43 . . . first wiring electrode; 45 . . . second wiring electrode; 51 . . . semiconductor substrate; 52 . . . buffer layer; 53 . . . etching stopping layer; 54 . . . protective layer; 101 . . . optical interconnection system; 103 . . . semiconductor light emitting device; 105 . . . driving circuit; 107 . . . optical waveguide substrate; 107a . . . optical waveguide; 109 . . . amplifying circuit; LS . . . structural body of layers; M1, M2 . . . module; PD1, PD2 . . . semiconductor photodetector; and PD3, PD4 . . . semiconductor photodetector array.

BEST MODES FOR CARRYING OUT THE INVENTION

In the following, embodiments of a semiconductor photodetector and manufacturing method of the same according to the present invention will now be explained using FIGS. 1 to 19. In the explanation of the drawings, elements that are the same or have the same function shall be provided With the same symbol and redundant description shall be omitted.

First Embodiment

Figure 1:
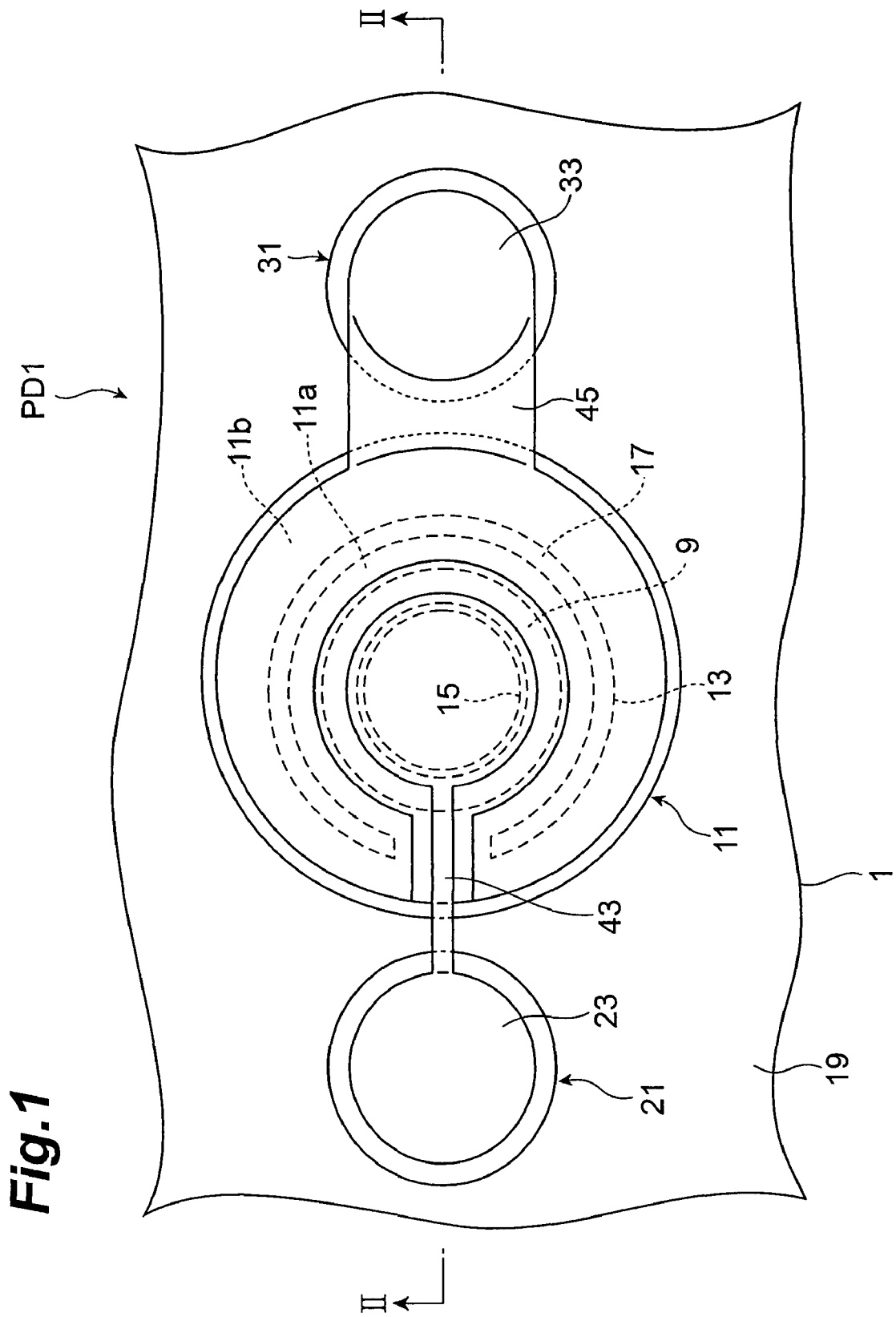
FIG. 1 is a plan view of a general arrangement of a first embodiment of a semiconductor photodetector according to the present invention.
Figure 2:
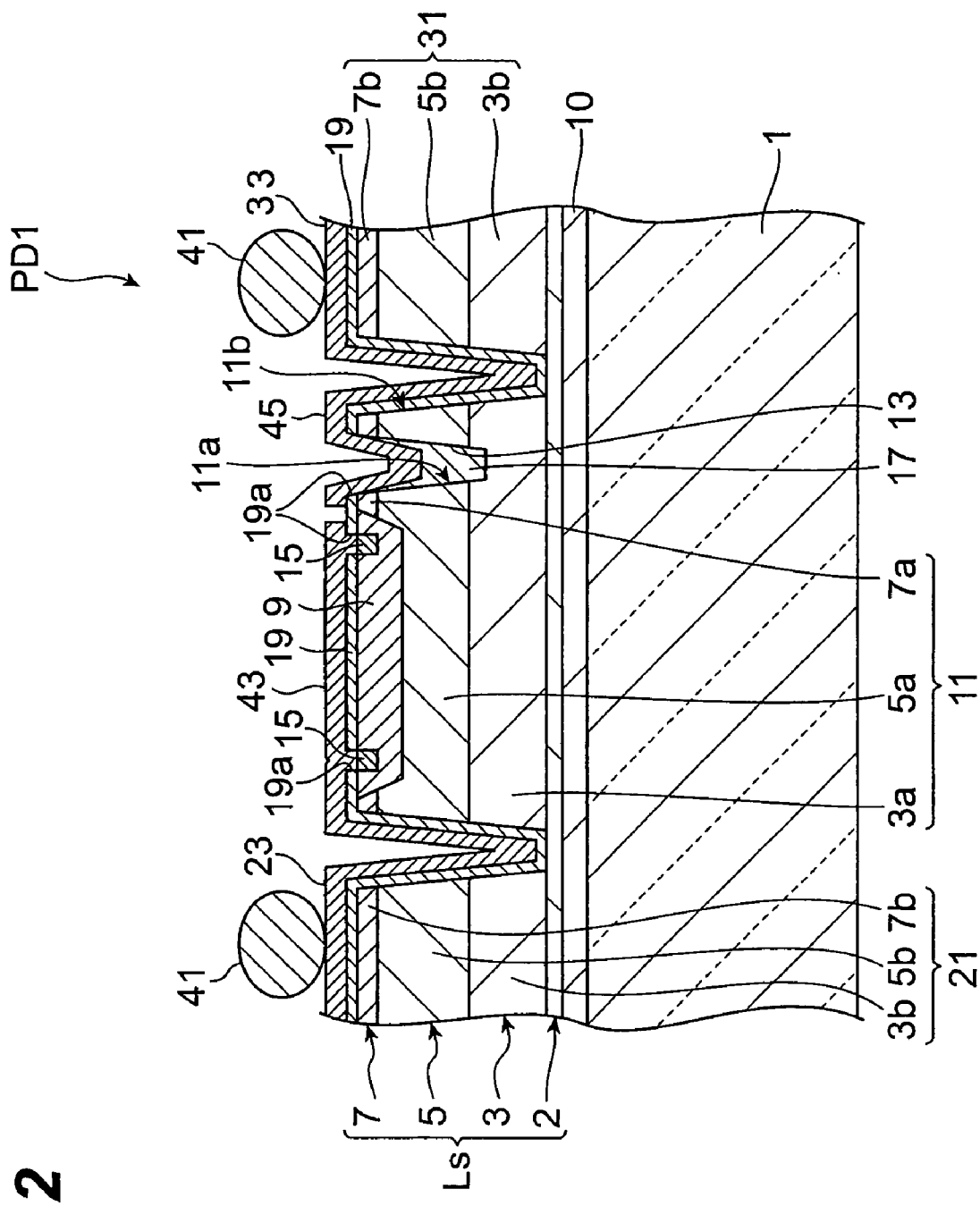
FIG. 2 is a diagram for explaining a sectional structure taken along line II-II of the semiconductor photodetector shown in FIG. 1.

FIG. 1 is a plan view of a general arrangement of a first embodiment of a semiconductor photodetector according to the present invention. FIG. 2 is a diagram for explaining a sectional structure taken along line II-II of FIG. 1 of the semiconductor device according to the first embodiment. In FIG. 1, bump electrodes 41 are omitted.

The semiconductor photodetector PD1 according to the first embodiment has a structural body of layers LS and a glass substrate 1. The semiconductor photodetector PD1 is a back-illuminated semiconductor photodetector, with which light is made incident on the structural body of layers LS from the glass substrate 1 side. Also, the semiconductor photodetector PD1 is, for example, a short-range optical communication photodetector for a wavelength band of 0.85 μm.

The structural body of layers LS includes an antireflection film 2, a high-concentration carrier layer 3 of n-type (first conductive type), a light absorbing layer 5 of n-type, and a cap layer 7 of n-type that are laminated successively. The glass substrate 1 is adhered via a film 10 onto the antireflection film 2 side of the structural body of layers LS. The glass substrate 1 has a thickness of approximately 0.3 mm and is optically transparent to incident light. The film 10 is formed on the high-concentration carrier layer 3 (antireflection film 2) side of the structural body of layers LS. The film 10 is comprised of silicon oxide (SiO$_2$) and the thickness thereof is approximately 0.1 μm.

The antireflection film 2 is positioned between the high-concentration carrier layer 3 and the silicon oxide film 10, and is formed, for example, of $SiN_x$. The thickness of the antireflection film 2 is set to $\lambda/4n$, where n is the refractive index of the antireflection film 2 and $\lambda$ is the wavelength of light to be received. For example, in the case of a short-range optical communication photodetector for a wavelength band of 0.85 µm, the thickness of the antireflection film 2 is 1000 to 3000 Å.

The structural body of layers LS is formed into a photosensitive portion 11, a first pad electrode positioning portion 21, and a second pad electrode positioning portion 31. The photosensitive portion 11, the first pad electrode positioning portion 21, and the second pad electrode positioning portion 31 are positioned in mutually separated states on the glass substrate 1.

The photosensitive portion 11 includes a high-concentration carrier layer 3a of n-type, a light absorbing layer 5a of n-type, and a cap layer of n-type 7a is shaped to a mesa-like form (truncated conical shape in the present embodiment). The cap layer 7a has a photosensitive region 9 of p-type (second conductive type) formed thereon. A top portions of the photosensitive portion 11 and the photosensitive region 9 have circular forms as viewed from a light-incident direction.

At the top portion of the photosensitive portion 11, a depression 13 is formed at the outer side of the photosensitive region 9 as viewed from the light-incident direction. The depression 13 reaches the high-concentration carrier layer 3a and is shaped to a groove-like form that surrounds the photosensitive region 9. The photosensitive portion 11 is thus arranged to include an inner portion 11a, which includes the photosensitive region 9 and is shaped to a mesa form, and an outer portion 11b, which is positioned so as to surround the inner portion 11a. As viewed from the light-incident direction, the depression 13 is formed to a C-like shape along the edge of the photosensitive region 9 while leaving alone a part of the top portion of the photosensitive portion 11 (a portion near the first pad electrode positioning portion 21).

An annular contact electrode 15 is positioned at the top surface side of the photosensitive region 9. This contact electrode 15 is electrically connected to the photosensitive region 9. The contact electrode 15 is formed of Ti—Pt—Au and has a thickness of approximately 1000 nm. Though the contact electrode 15 is positioned so as to be embedded in the photosensitive region 9 (cap layer 7a) in FIG. 2, it is not limited thereto and may instead be positioned above the photosensitive region 9 (cap layer 7a).

A contact electrode 17 is positioned at a bottom portion of the depression 13. This contact electrode 17 is electrically connected to the high-concentration carrier layer 3a. The contact electrode 17 is formed of a laminate of Au—Ge/Ni/Au and has a thickness of approximately 1000 nm. Similar to the depression 13, the contact electrode 17 is formed to a C-like shape as viewed from the light-incident direction.

At the top surface side of the photosensitive portion 11, a passivation film 19 is formed so as to cover the photosensitive region 9.

Each of the first pad electrode positioning portion 21 and the second pad electrode positioning portion 31 includes a high-concentration carrier layer 3b of n-type, a light absorbing layer 5b of n-type, and a cap layer 7b of n-type, and is formed to a mesa-like shape (truncated conical shape in the present embodiment). The top portions of the first pad electrode positioning portion 21 and the second pad electrode positioning portion 31 are circular as viewed form the light-incident direction.

At a top portion of the first pad electrode positioning portion 21, a first pad electrode 23 is formed above the passivation film 19. At a top portion of the second pad electrode positioning portion 31, a second pad electrode 33 is formed above the passivation film 19. Each of the first pad electrode 23 and the second pad electrode 33 is formed of Ti—Pt—Au and has a thickness of approximately 1.5 µm. The first pad electrode 23 and the second pad electrode 33 are made substantially the same in height from glass substrate 1, and have circular shapes as viewed from the light-incident direction. As shown in FIG. 2, a bump electrode 41 is positioned at each of the first pad electrode 23 and the second pad electrode 23.

The high-concentration carrier layer 3 (3a, 3b) is a compound semiconductor layer and is comprised, for example, of AlGaAs (Al composition: 0.3) with a carrier concentration of approximately $1 \times 10^{18}/cm^3$. The thickness of the high-concentration carrier layer 3 (3a, 3b) is approximately 2 µm. The Al composition ratio of the high-concentration carrier layer 3 is preferably no less than 0.3. Though it is sufficient for the Al composition ratio x to be 0.04 when light with a wavelength of 850 nm or more is to be received, an Al composition ratio of 0.3 or more is preferable for a more favorable high-concentration carrier layer 3. However, the Al composition ratio of the high-concentration carrier layer 3 may be determined suitably according to the wavelength of the light to be received, and for example, to receive a short wavelength light of 650 nm wavelength, an Al composition ratio of 0.4 or more is necessary.

The light absorbing layer 5 (5a, 5b) is a compound semiconductor layer and is formed, for example, of GaAs with a carrier concentration of approximately $1 \times 10^{14}/cm^3$. The thickness of the light absorbing layer 5 (5a, 5b) is approximately 3 µm.

The cap layer 7 (7a, 7b) is a compound semiconductor layer and is formed, for example, of AlGaAs (Al composition: 0.3) with a carrier concentration of approximately $5 \times 10^{15}/cm^3$. The thickness of the cap layer 7 (7a, 7b) is approximately 0.3 µm.

The photosensitive region 9 is formed by thermally diffusing a p-type impurity (such as Zn) in a desired region of the cap layer 7a and inverting the region to p-type, and the depth thereof is approximately 0.4 µm. The diameter of the photosensitive region 9 is 5 to 200 µm φ. The width of the depression 13 (groove) is approximately 5 µm. Since the photosensitive diameter depends on the characteristics demanded of the photodetector, it can be designed to be within a wide range of 1 µm to 10 mm.

The contact electrode 15 and the first pad electrode 23 are electrically connected by the first wiring electrode 43. The first wiring electrode 43 extends between the photosensitive portion 11 and the first pad electrode positioning portion 21 and is positioned above the passivation film 19. The first wiring electrode 43 passes above a region of the photosensitive portion 11 at which the depression 13 is not formed and extends along a side surface of the photosensitive portion 11 and a side surface of the first pad electrode positioning portion 21. The first wiring electrode 43 is formed of Ti—Pt—Au and has a thickness of approximately 1.5 µm.

A part of the first wiring electrode 43 that is positioned above the photosensitive portion 11 is positioned above the photosensitive region 9 so as to cover the photosensitive region 9 and has a circular shape. In the present embodiment, the part of the first wiring electrode 43 positioned above the photosensitive portion 11 functions as a light reflecting film. A light reflecting film separate from the first wiring electrode 43 may be formed instead.

The first wiring electrode 43 has one end thereof connected to the contact electrode 15 via a contact hole 19a, formed in the passivation film 19, and has the other end connected to the first pad electrode 23. The photosensitive region 9 is thereby electrically connected, through the contact electrode 15 and the first wiring electrode 43, to the first pad electrode 23 (bump electrode 41). That is, the leading out of the electrode at the photosensitive region 9 side is realized by the contact electrode 15, the first wiring electrode 43, the first pad electrode 23, and the bump electrode 41.

The contact electrode 17 and the second pad electrode 33 are electrically connected by the second wiring electrode 45. The second wiring electrode 45 extends between the depression 13 of the photosensitive portion 11 and the second pad electrode positioning portion 31 and is positioned above the passivation film 19. A part of the second wiring electrode 45 that is positioned above the photosensitive portion 11 is formed to a C-like shape as viewed from the light-incident direction so as not to contact the first wiring electrode 43. The second wiring electrode 45 extends along a side surface that is a part of the depression 13, a side surface of the photosensitive portion 11, and a side surface of the second pad electrode positioning portion 31. The second wiring electrode 45 is formed of Ti—Pt—Au and has a thickness of approximately 1.5 μm.

The second wiring electrode 45 has one end thereof connected to the contact electrode 17 via the contact hole 19a formed in the passivation film 19 and has the other end connected to the second pad electrode 33. The high-concentration carrier layer 3a is thereby electrically connected, through the contact electrode 17 and the second wiring electrode 45, to the second pad electrode 33 (bump electrode 41). That is, the leading out of the electrode at the high-concentration carrier layer 3a side is realized by the contact electrode 17, the second wiring electrode 45, the second pad electrode 33, and the bump electrode 41.

A method of manufacturing the semiconductor photodetector PD1 with the above-mentioned structure will now be explained with reference to FIGS. 3 to 12. FIGS. 3 to 12 are explanatory diagrams for explaining a method of manufacturing the semiconductor photodetector according to the first embodiment and show longitudinal sectional structures of the semiconductor photodetector.

In this manufacturing method, the following first to eleventh steps are executed successively.

(First Step)

First, a semiconductor substrate 51 and a glass substrate 1 are prepared.

(Second Step)

The semiconductor substrate 51, for example, has a thickness of 300 to 500 μm and is formed of a GaAs of n-type with a carrier concentration of $1 \times 10^{18}/cm^3$. A buffer layer 52, an etching stopping layer 53, and a protective layer 54 are grown and laminated successively on the semiconductor substrate 51 by a hydride vapor phase epitaxy method, chloride vapor phase epitaxy method, metal-organic chemical vapor deposition method (MOCVD method), or molecular beam epitaxy method (MBE method), etc. (see FIG. 3). Thereafter, the cap layer 7 of n-type, the light absorbing layer 5 of n-type, and the high-concentration carrier layer 3 of n-type are grown and laminated successively on protective layer 54 by the hydride vapor phase epitaxy method, chloride vapor phase epitaxy method, MOCVD method, or MBE method, etc. (see FIG. 3).

The buffer layer 52 is comprised of non-doped GaAs and has a thickness of approximately 0.05 μm. The etching stopping layer 53 is comprised of non-doped AlGaAs (Al composition: 0.4) and has thickness of approximately 1.0 μm. The etching stopping layer 53 is formed so as to be positioned between the semiconductor substrate 51 and the cap layer 7. The Al composition ratio of the etching stopping layer 53 is preferably 0.4 or more. This is because this $Al_{0.5}Ga_{0.5}As$ is not etched readily by an etching solution used in etching GaAs as shall be described below. The protective layer 54 is comprised of non-doped GaAs and has a thickness of approximately 0.2 μm. The protective layer 54 is formed so as to be positioned between the etching stopping layer 53 and the cap layer 7.

(Third Step)

Figure 3:
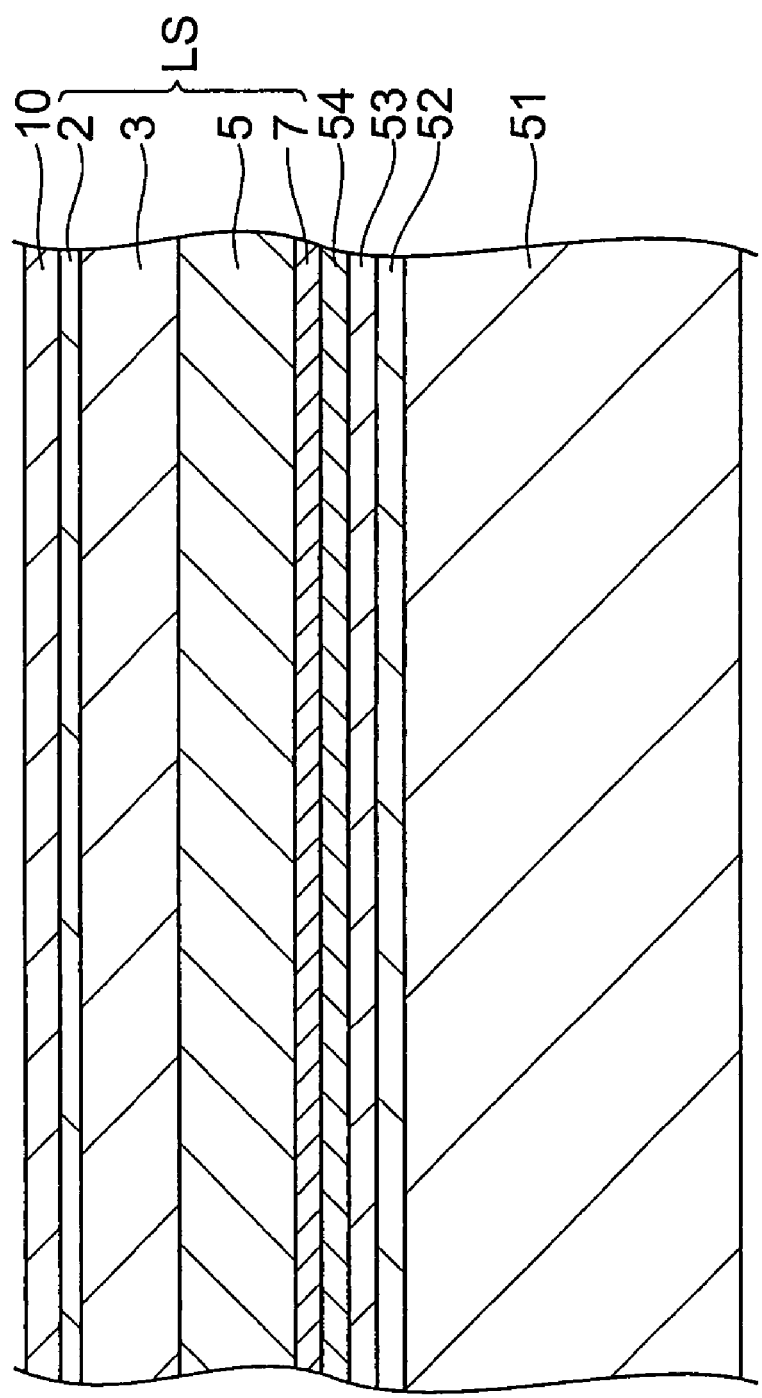
FIG. 3 is a sectional view for explaining a manufacturing step of the first embodiment of the semiconductor photodetector according to the present invention (part 1)

In the third step, the antireflection film 2 and the film 10 are formed successively above the high-concentration carrier layer 3 by a plasma chemical vapor deposition (PCVD) method (see FIG. 3). The antireflection film 2 is formed so as to be positioned between the film 10 and the high-concentration carrier layer 3.

By the above-mentioned first and second steps, the structural body of layers LS and the films 52 to 54 and 10 are formed on the semiconductor substrate 51.

(Fourth Step)

Figure 4:
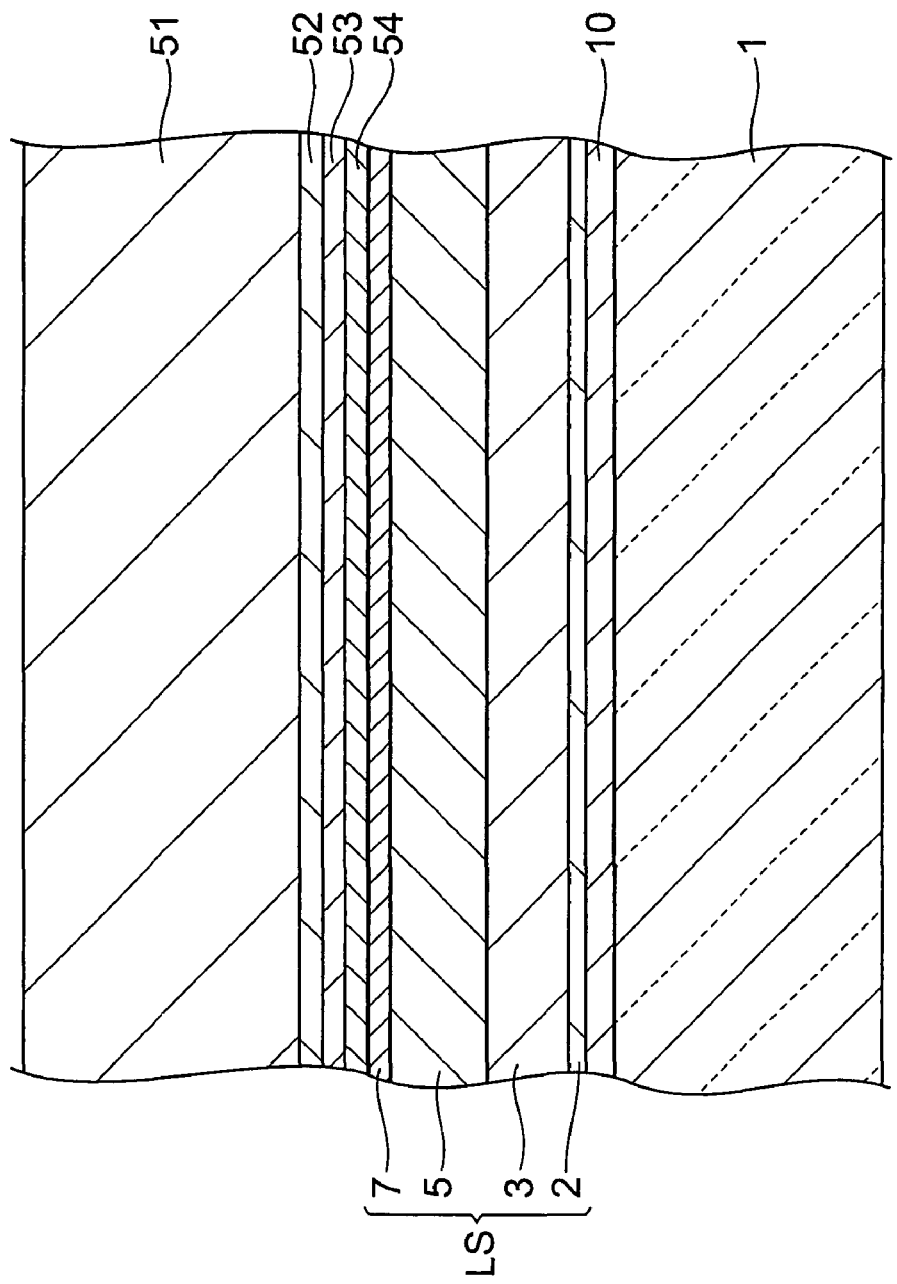
FIG. 4 is a sectional view for explaining a manufacturing step of the first embodiment of the semiconductor photodetector according to the present invention (part 2)
Figure 5:
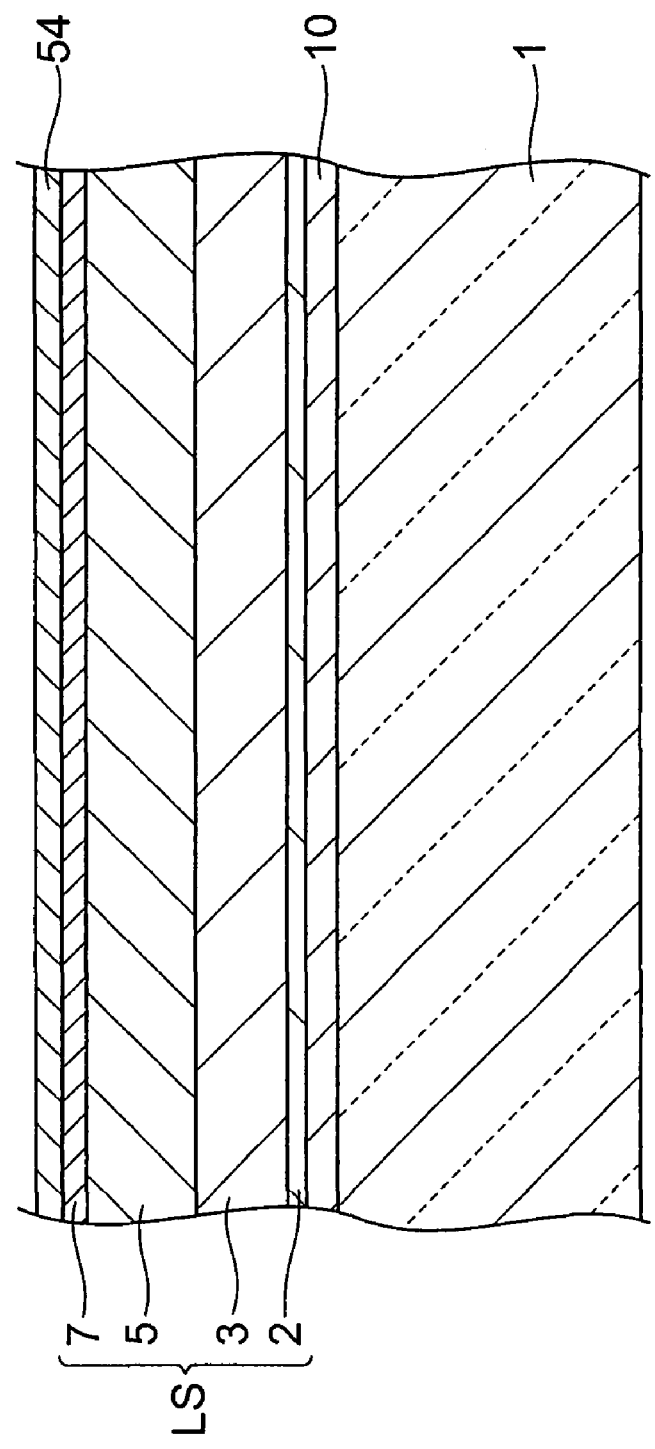
FIG. 5 is a sectional view for explaining a manufacturing step of the first embodiment of the semiconductor photodetector according to the present invention (part 3)

In the fourth step, the semiconductor substrate 51, on which the structural body of layers LS and the films 52 to 54 and 10 have been formed, and the glass substrate 1 are adhered together (see FIG. 4). First, one surface (top surface) of the glass substrate 1 is cleaned. The glass substrate 1 and the semiconductor substrate 51 are then overlapped so that the cleaned top surface of the glass substrate 1 and the outermost surface film 10 of the semiconductor substrate 51 contact each other. Pressurization and heating are then performed in this overlapped state to adhere the substrates 51 and 1 by fusing.

In particular, the pressure to be applied across the overlapped glass substrate 1 and the semiconductor substrate 51 is approximately 98 kPa and as the heating temperature in this process, 500 to 700° C. is preferable. Since the outermost surface film 10 on the semiconductor substrate 51 is comprised of silicon oxide, by pressurizing and heating at such conditions, the outermost surface film 10 and the top surface of the glass substrate 1 become fused, and the semiconductor substrate 51 and the glass substrate 1 thus become adhered to each other.

In carrying out this adhesion step, preferably, not only the top surface of the glass substrate 1, but the outermost surface film 10 on the semiconductor substrate 51 is also clean. For this purpose, such measures are taken as performing the fusing work immediately after taking out the semiconductor substrate 51 from the PCVD equipment in which the outermost surface film 10 was formed.

Also preferably, the glass substrate used has a thermal expansion coefficient close to that of GaAs. The stress that arises between the semiconductor substrate 51 and the glass substrate 1 due to a thermal expansion coefficient difference in a cooling process after heating can thereby be made as small as possible and lowering of the adhesion strength and forming of crystal defects due to the stress can be minimized.

(Fifth Step)

In the fifth step, the semiconductor substrate 51 is removed. After the glass substrate 1 and the semiconductor substrate 51 have been adhered together, the other surface (back surface) of the semiconductor substrate 51 is exposed at the opposite side of the glass substrate 1. In the present step, the semiconductor substrate 51 and the buffer layer 52 are removed by etching from the back surface side of the semiconductor substrate 51.

First, an etching solution that can etch the semiconductor substrate 51 and the buffer layer 52 but is slow in etching rate with respect to the etching stopping layer 53 is used to remove the semiconductor substrate 51 and the buffer layer 52. In a sixth step that follows, an etching solution that can etch the etching stopping layer 53 but is slow in etching rate with respect to the protective layer 54 is used to remove the etching stopping layer 53. The glass substrate 1, having the structural body of layers LS, etc., laminated thereon, is thereby obtained.

As the etching solutions, a mixed solution of ammonia water ($NH_4OH$) and hydrogen peroxide ($H_2O_2$)($NH_4OH$:$H_2O_2$=2:1) and hydrochloric acid (HCl) are preferable. First, the glass substrate 1 and the semiconductor substrate 51, which have been adhered together, are immersed in the mixed solution of $NH_4OH$ and $H_2O_2$. The semiconductor substrate 51 is thereby etched from the back surface side. As the etching proceeds and when the semiconductor substrate 51 becomes removed, the buffer layer 52 (GaAs), which had been grown on the semiconductor substrate 51, starts to become etched. Thereafter as the etching proceeds further, the buffer layer 52 becomes removed and the etching stopping layer 53 becomes exposed inside the etching solution. Here, since the etching rate of the etching stopping layer 53 ($Al_{0.5}Ga_{0.5}As$) in the present etching solution is extremely slow, when the etching stopping layer 53 becomes exposed, the etching stops automatically. The semiconductor substrate 51 and the buffer layer 52 are thus removed first.

(Sixth Step)

In the sixth step, the etching stopping layer 53 and the protective layer 54 are removed. In continuation from the fifth step, the glass substrate 1, on which the etching stopping layer 53, the protective layer 54, and the structural body of layers LS, etc., remain, is taken out from the mixed solution of $NH_4OH$ and $H_2O_2$ and after washing with water and drying, is immersed in the hydrochloric acid solution. Here, the HCl solution is preferably heated to approximately 50° C. in advance to increase the etching rate. Since GaAs is hardly etched by HCl, only the etching stopping layer 53 is etched in this step, and when the protective layer 54 (GaAs) becomes exposed, the etching stops automatically (see FIG. 5). The etching stopping layer 53 is thus removed.

Figure 6:
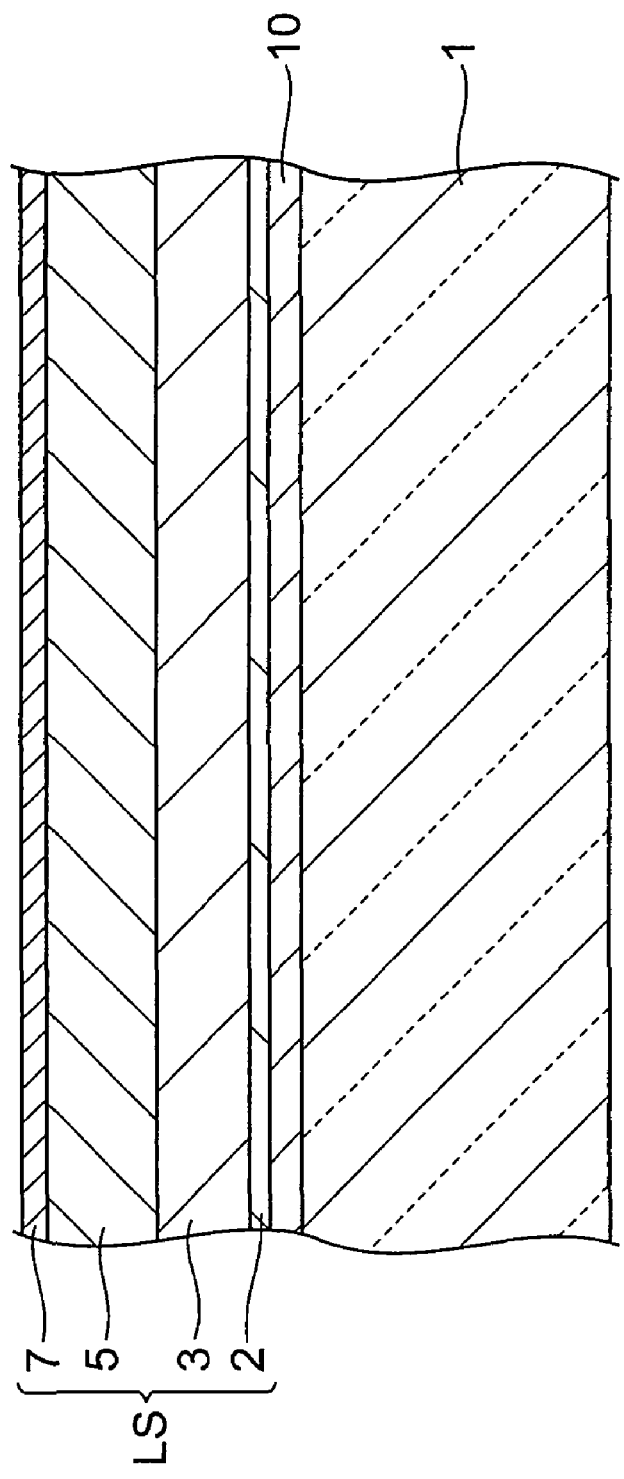
FIG. 6 is a sectional view for explaining a manufacturing step of the first embodiment of the semiconductor photodetector according to the present invention (part 4)

The protective layer 54 is then removed (see FIG. 6). The protective layer 54 can be removed With the mixed solution of $NH_4OH$ and $H_2O_2$. This is because the protective layer 54 is GaAs again, and since the cap layer that is exposed subsequently is an AlGaAs layer, it will not be etched by this etching solution.

(Seventh Step)

Figure 7:
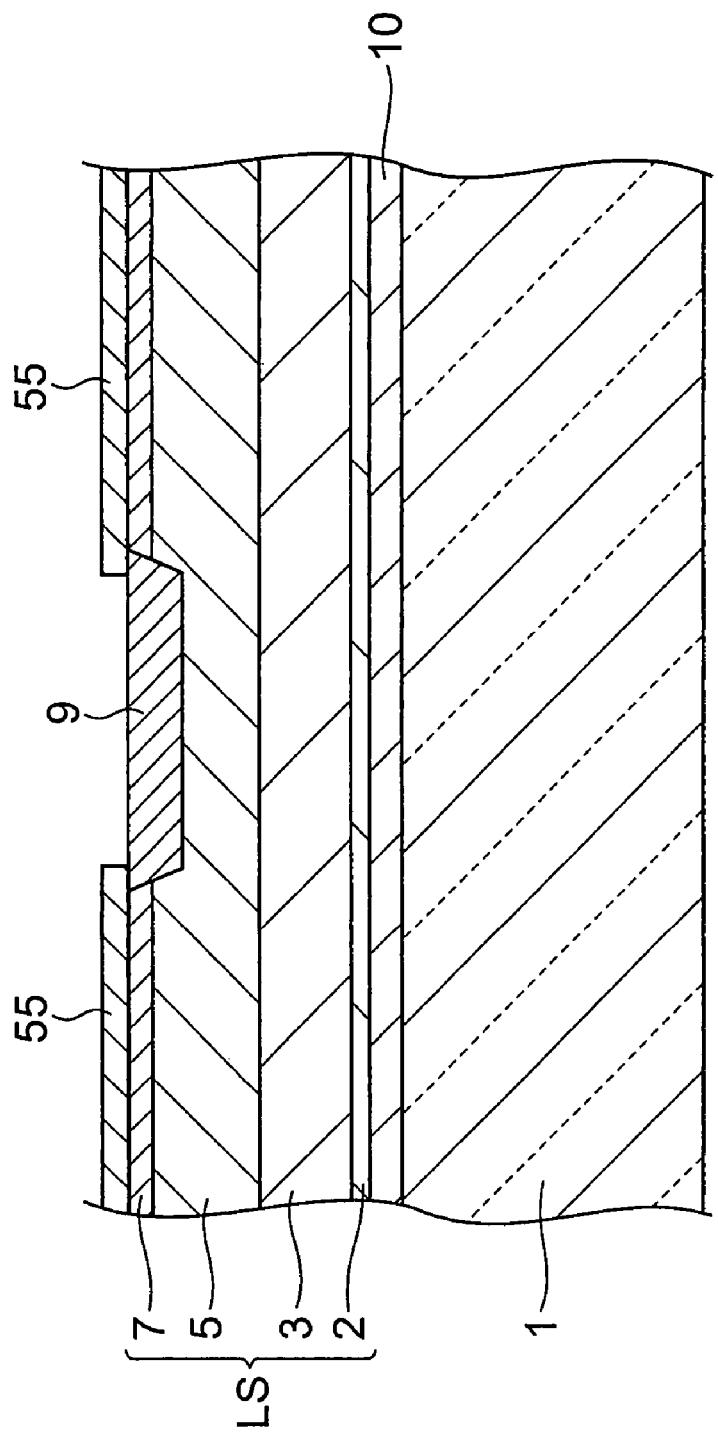
FIG. 7 is a sectional view for explaining a manufacturing step of the first embodiment of the semiconductor photodetector according to the present invention (part 5)
Figure 8:
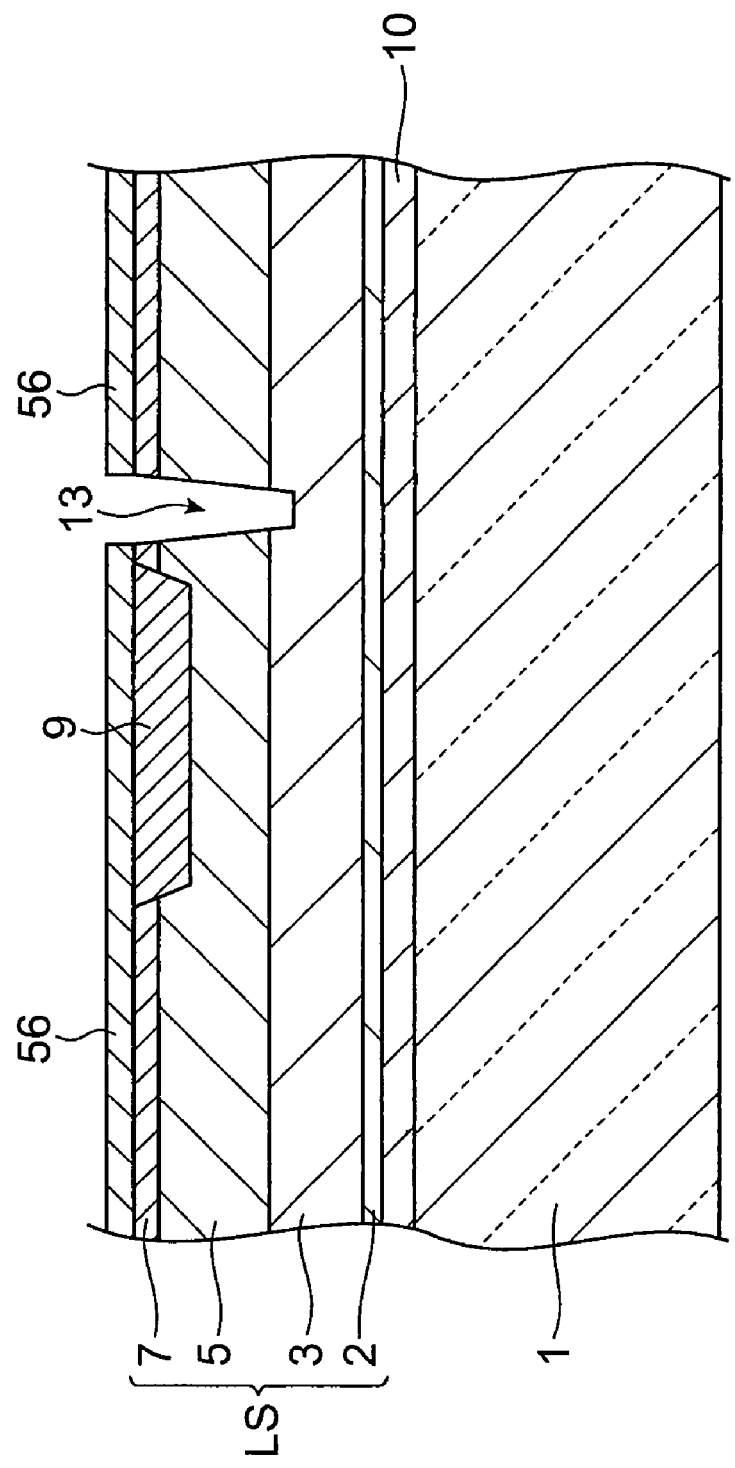
FIG. 8 is a sectional view for explaining a manufacturing step of the first embodiment of the semiconductor photodetector according to the present invention (part 6)
Figure 9:
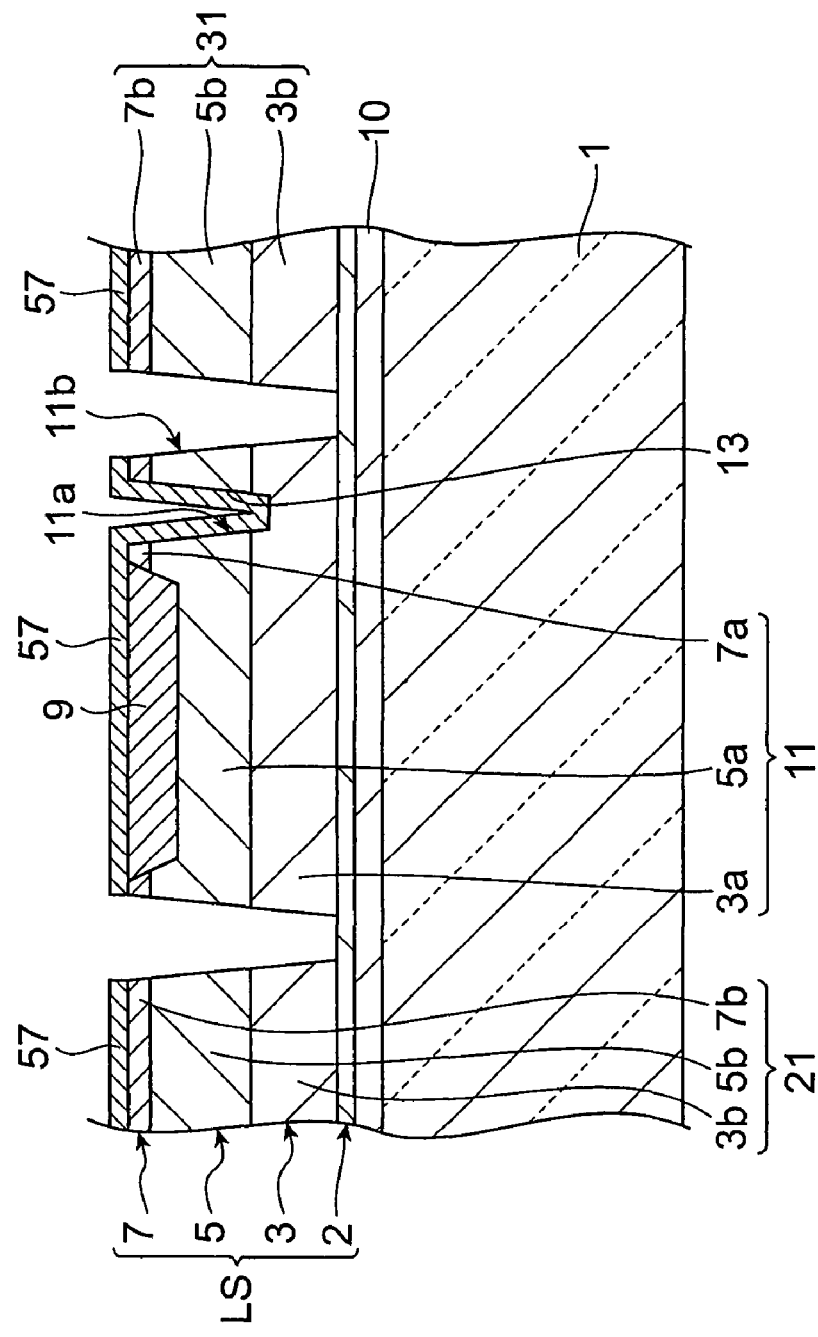
FIG. 9 is a sectional view for explaining a manufacturing step of the first embodiment of the semiconductor photodetector according to the present invention (part 7)
Figure 10:
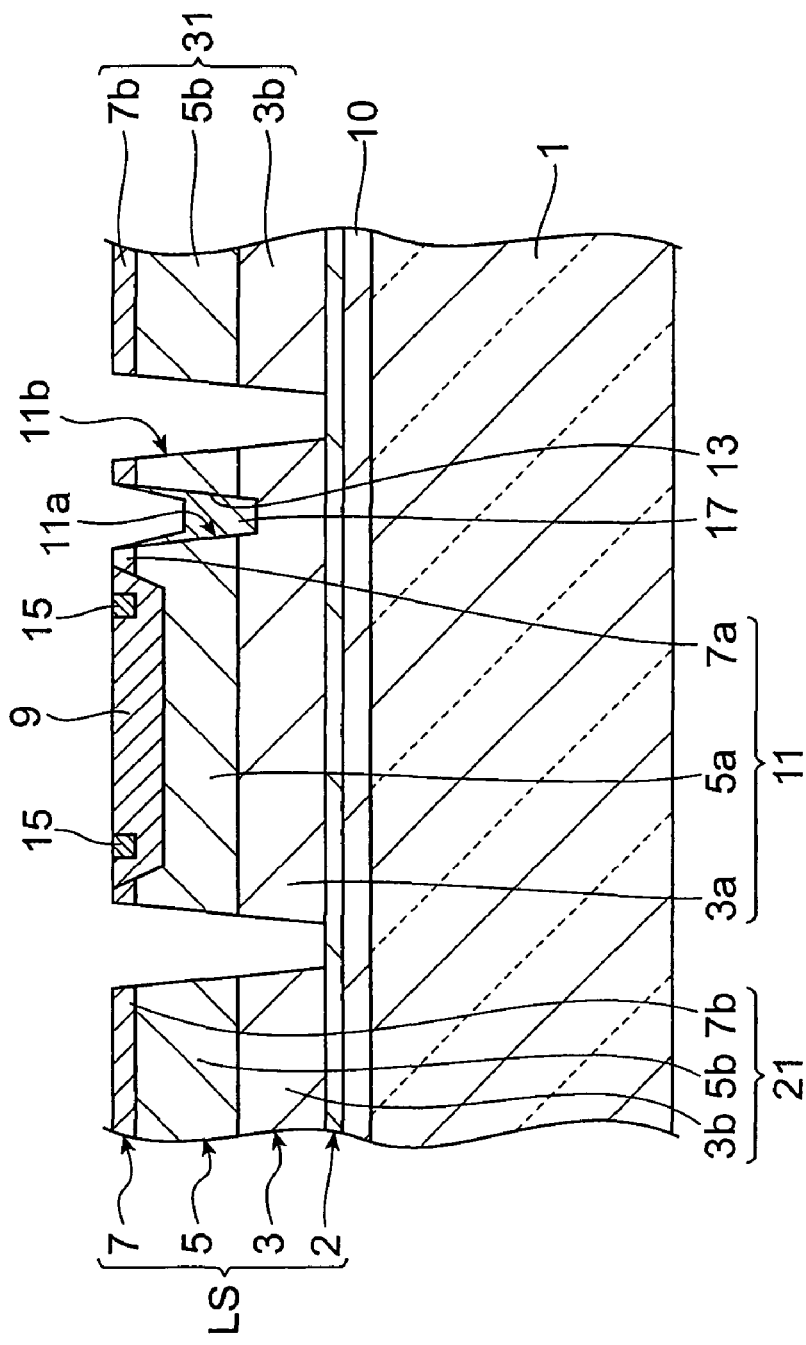
FIG. 10 is a sectional view for explaining a manufacturing step of the first embodiment of the semiconductor photodetector according to the present invention (part 8)
Figure 11:
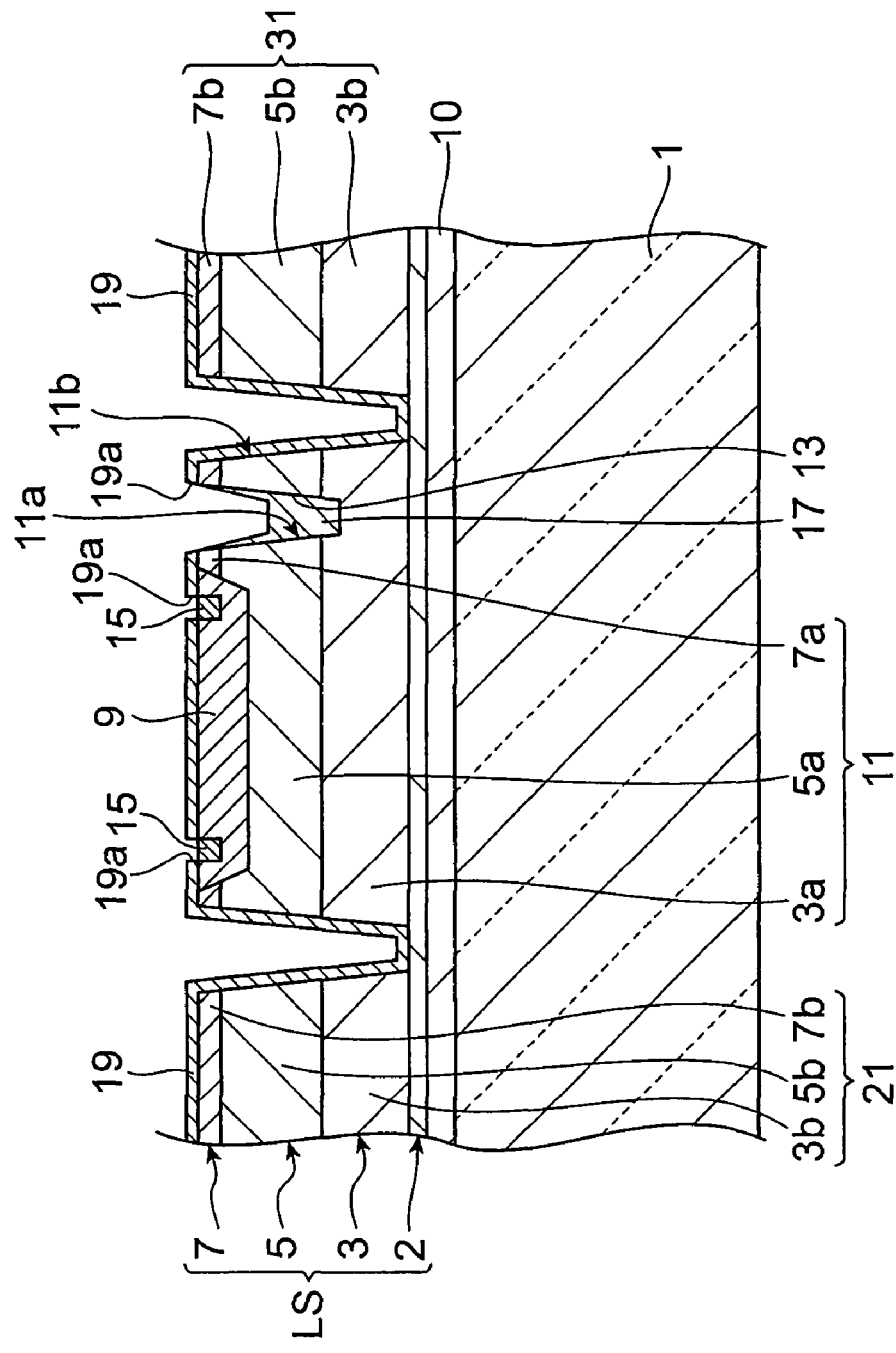
FIG. 11 is a sectional view for explaining a manufacturing step of the first embodiment of the semiconductor photodetector according to the present invention (part 9)
Figure 12:
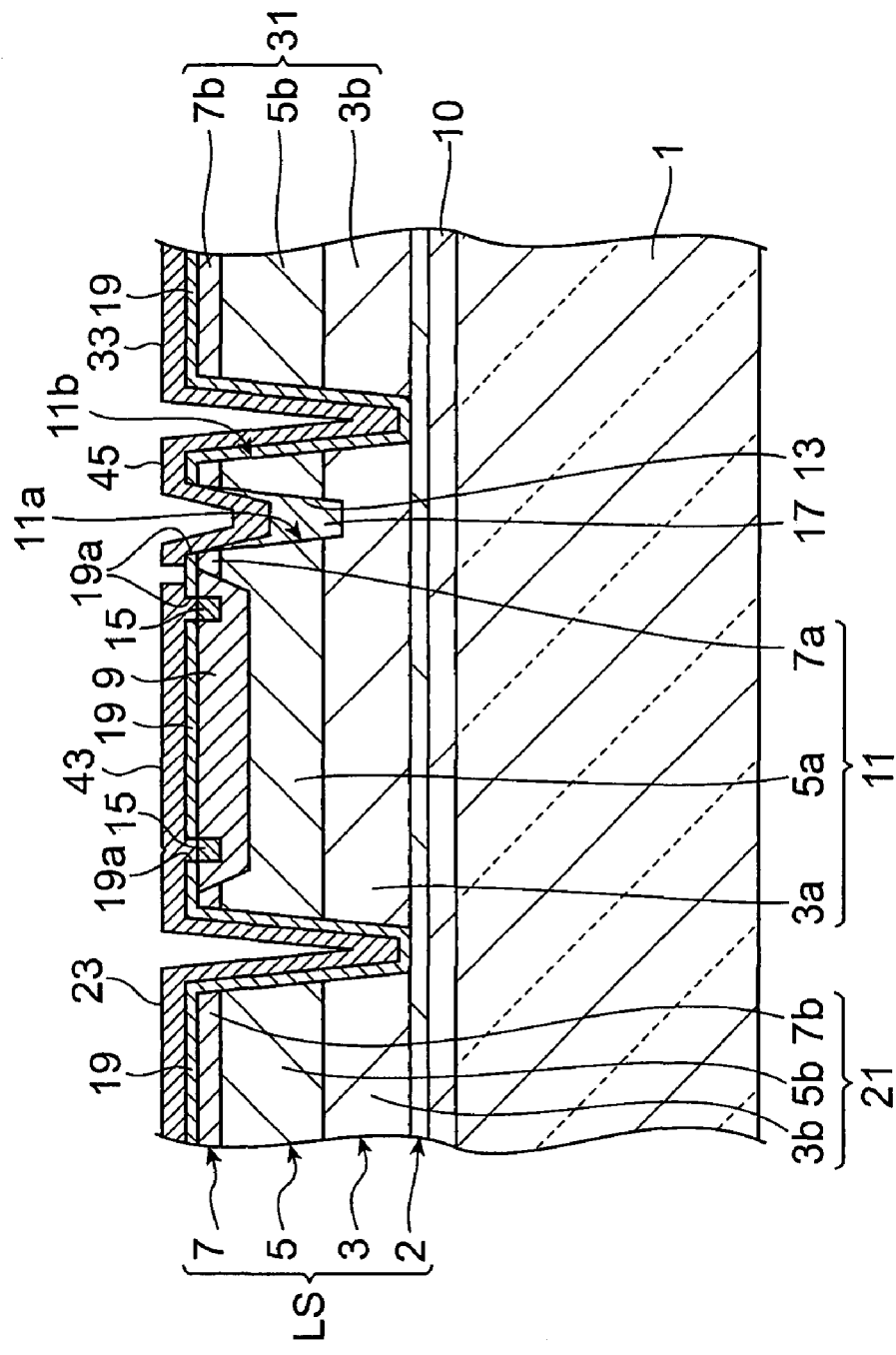
FIG. 12 is a sectional view for explaining a manufacturing step of the first embodiment of the semiconductor photodetector according to the present invention (part 10)

In the seventh step, a film 55, comprised of $SiO_2$ or $SiN_x$ is formed on the cap layer 7 and a part of the film 55 present at a position at which the photosensitive region 9 is scheduled to be formed is patterned and opened (see FIG. 7). Thereafter, using the patterned film 55 on the cap layer 7 as a mask, an impurity (for example, Zn) is thermally diffused and a part of the cap layer 7 is inverted to p-type. The photosensitive region 9 is thereby formed (see FIG. 7). The film 55 is then removed by buffered hydrofluoric acid (BHF).

(Eighth Step)

In the eighth step, a resist film 56, having an opening at a position at which the depression 13 is scheduled to be formed, is formed on the cap layer 7. A photolithography method can be used to form a resist film 56. Then using the resist film 56 as a mask, etching (wet etching) using a mixed solution of $Br_2$ and methanol is performed until the high-concentration carrier layer 3 becomes exposed. The depression 13 is thereby formed (see FIG. 8). The resist film 56 is then removed.

(Ninth Step)

In the ninth step, a resist film 57, having an opening at a desired position, is formed on the cap layer 7. A photolithography method can be used to form the resist film 57. Then using the resist film 57 as a mask, etching (wet etching) using a mixed solution of $Br_2$ and methanol is performed until the antireflection film 2 becomes exposed and a depression is formed. The photosensitive portion 11, the first pad electrode positioning portion 21, and the second pad electrode positioning portion 31 are thereby separated electrically from each other and shaped into mesa forms (see FIG. 9). That is, the photosensitive portion 11 is made to include the high-concentration carrier layer 3a, the light absorbing layer 5a, and the cap layer 7a, and each of the first pad electrode positioning portion 21 and the second pad electrode positioning portion 31 is made to include the high-concentration carrier layer 3b, the light absorbing layer 5b, and the cap layer 7b. Here, by making the resist film 57 be present at a position corresponding to an outer portion 11b, the progress of etching can be controlled appropriately not only in the depth direction but also towards the sides and the forming of the depression 13 as well as the separation of the photosensitive portion 11, the first pad electrode positioning portion 21, and the second pad electrode positioning portion 31 can be performed appropriately. The yield of manufacturing the semiconductor photodetector PD1 can thus be increased. The resist film 57 is then removed.

(Tenth to Thirteenth Steps)

The tenth step to the thirteenth step will now be explained. In these steps, a resist film (not shown) with an opening at a position corresponding to the depression 13 is formed. Then using the resist film as a mask, the contact electrode 17, formed of Ti—Pt—Au is formed, by vapor deposition and a lift-off method, on the high-concentration carrier layer 3 (3a) that had become exposed by the forming of the depression 13 (see FIG. 10). Also, the resist film is formed again so that there is an opening at the position at which the contact electrode 15 is to be formed, and using this resist film as a mask, the contact electrode 15, comprised of Au—Ge/Ni/Au, is formed by vapor deposition and a lift-off method on the photosensitive region 9 (likewise see FIG. 10). The resist films are then removed. Though the contact electrode 15 is formed so as to be embedded in the photosensitive region 9 (cap layer 7a) in FIG. 10, it is not limited thereto and may instead be positioned on the top surface of the photosensitive region 9 (cap layer 7a).

By the PCVD method, the passivation film 19, comprised of $SiN_x$, is formed on the top surface. A resist film (not shown), having openings at positions corresponding to the contact electrodes 15 and 17, is then formed, and using this resist film as a mask, the contact holes 19a are formed in the passivation film 19 (see FIG. 11). The resist film is then removed.

A resist film (not shown), having openings at positions corresponding to the first pad electrode 23, the second pad electrode 33, the first wiring electrode 43, and the second wiring electrode 45, is then formed. Then using this resist film as a mask, the first pad electrode 23, the second pad electrode 33, the first wiring electrode 43, and the second wiring electrode 45, which are comprised of Ti—Pt—Au, are formed by the lift-off method (see FIG. 12). In this process, the first wiring electrode 43 is formed so as to cover the photosensitive region 9. Here, the first pad electrode 23 and the first wiring electrode 43 are formed integrally, and the second pad electrode 33 and the second wiring electrode 45 are formed integrally. The resist film is then removed. Thereafter, sintering is performed in an $H_2$ atmosphere.

By these first to thirteenth steps, the semiconductor photodetector PD of the arrangement shown in FIGS. 1 and 2 is completed.

The bump electrodes 41 can be obtained by forming solder on the first pad electrode 23 and the second pad electrode 33 by a plating method, solder ball mounting method, or printing method and then performing reflow. Also, the bump electrodes 41 are not limited to those of solder and may instead be gold bumps, nickel bumps, or copper bumps or conductive resin bumps containing a conductive filler or other metal.

In semiconductor photodetector PD1 of the first embodiment, even when the high-concentration carrier layer 3, the light absorbing layer 5, the cap layer 7, etc., are formed as thin films, the mechanical strength of the structural body of layers LS (the laminated high-concentration carrier layer 3, light absorbing layer 5, and cap layer 7) is maintained by the glass substrate 1. Also, in the first embodiment, since there is no need to form a portion at which the substrate thickness remains as in the conventional semiconductor photodetector, the semiconductor photodetector PD1 can be made compact readily.

In semiconductor photodetector PD1 according to the first embodiment, since the structural body of layers LS is adhered to the glass substrate 1 via the film 10, the structural body of layers LS and the glass substrate 1 can be adhered together without using an adhesive agent, etc. Light made incident from the glass substrate 1 side can thus reach the structural body of layers LS without being absorbed by the adhesive agent, etc.

In semiconductor photodetector PD1 according to the first embodiment, the antireflection film 2 is formed between the film 10 and the high-concentration carrier layer 3 (3a). The reflection of light that is about to become incident on the photosensitive region 9 is thereby prevented and since the amount of light incident on the light absorbing layer thus increases, photosensitivity can be improved.

In semiconductor photodetector PD1 according to the first embodiment, since the first wiring electrode 43 (light reflecting film) is formed so as to cover the photosensitive region 9, light that has passed once through the light absorbing layer without being absorbed is reflected by the first wiring electrode 43 and is made incident on the light absorbing layer 5a again. The photosensitivity can thus be improved.

In semiconductor photodetector PD1 according to the first embodiment, the structural body of layers LS is constituted by the photosensitive portion 11, the first pad electrode positioning portion 21, and the second pad electrode positioning portion 31, the depression 13 which reaches the high-concentration carrier layer 3a is formed in the photosensitive portion 11, the first wiring electrode 43 is formed to extend along the side surfaces of the photosensitive portion 11 and the first pad electrode positioning portion 21 between the photosensitive portion 11 and the first pad electrode positioning portion 21, and the second wiring electrode 45 is formed to extend along the side surfaces of the depression 13, the photosensitive portion 11, and the second pad electrode positioning portion 31 between the depression 13 and the second pad electrode positioning portion 31. Since the first and second pad electrode positioning portions 21 and 31 and the photosensitive portion 11 are thereby separated from each other, the parasitic capacitance can be reduced further. Also, by electrically connecting the high-concentration carrier layer 3a of the photosensitive portion 11 to the second pad electrode 33 by the second wiring electrode 45 through the depression 13, formed so as to reach the high-concentration carrier layer 3a of the photosensitive portion 11, an electrode is directly lead out from the high-concentration carrier layer 3a of the photosensitive portion 11 and the series resistance can thus be reduced significantly. By the above, the semiconductor photodetector PD1 of excellent, high-speed response characteristics can be realized.

When the diameter (area) of the photosensitive region 9 is made large, the device's capacitance becomes large and the CR product, which indicates the degree of impediment of transmission of high-frequency signals, becomes large. However, in accordance with the present embodiment, since the series resistance is reduced significantly as mentioned above, the CR product is made small. Thus when the CR product is to be maintained at the same level, that is, the high-speed response characteristics are to be maintained at the same level, the area of the photosensitive region 9 can be made large by employing the semiconductor photodetector according to the present embodiment.

In semiconductor photodetector PD1 according to the first embodiment, since each of the first pad electrode positioning portion 21 and the second pad electrode positioning portion 31 includes the high-concentration carrier layer 3b, the light absorbing layer 5b, and the cap layer 7b, the first pad electrode 23 and the second pad electrode 33 can readily be positioned at substantially the same height and the mounting of the semiconductor photodetector PD1 by bump bonding is enabled.

In semiconductor photodetector PD1 according to the first embodiment, since not only the first pad electrode positioning portion 21 but the second pad electrode positioning portion 31 is also separated from the photosensitive portion 11, the interval between the photosensitive portion 11 (photosensitive region 9) and the first pad electrode 23 and the interval between the photosensitive portion 11 (photosensitive region 9) and the second pad electrode 33 become comparatively wide. However, since the electrodes are lead out directly from the high-concentration carrier layer 31, the series resistances are reduced significantly even when the wiring lengths become long.

In semiconductor photodetector PD1 according to the first embodiment, the depression 13 is shaped to a groove-like form so as to surround the photosensitive region 9. The area of connection of the high-concentration carrier layer 3a of the photosensitive portion 11 and the second wiring electrode 45 (contact electrode 17) is thus made large and the series resistance can be reduced further.

In semiconductor photodetector PD1 according to the first embodiment, the bump electrodes 41 are positioned at the first pad electrode 23 and the second pad electrode 33. The semiconductor photodetector PD1 can thereby be mounted without increasing the wiring resistance.

In the method of manufacturing the semiconductor photodetector PD1 according to the first embodiment, since the semiconductor substrate 51 is removed after the semiconductor substrate 51, with the structural body of layers LS formed thereon, and the glass substrate 1 are adhered so that the silicon oxide film 10, formed on the outermost surface side of the structural body of layers LS, contacts one surface of the glass substrate 1, the semiconductor photodetector PD1, with which the glass substrate 1 is adhered onto the light-incident surface side of the structural body of layers LS via the film 10, can be manufactured readily.

In the method of manufacturing the semiconductor photodetector PD1, since the glass substrate 1 is present even after removal of the semiconductor substrate 51, the mechanical strength of the structural body of layers LS is maintained by the glass substrate 1 even in subsequent manufacturing steps. Prior to adhesion of the glass substrate 1, the mechanical strength of the structural body of layers LS is maintained by the semiconductor substrate 51.

The method of manufacturing the semiconductor photodetector PD1 includes the step, carried out prior to the step of forming the structural body of layers LS (the laminated high-concentration carrier layer 3, light absorbing layer 5, and cap layer 7), of forming the etching stopping layer 53 so as to be positioned between the semiconductor substrate 51 and the structural body of layers LS, and the step, carried out after the step of removing the semiconductor substrate 51, of removing the etching stopping layer 53 by wet etching. Thus by suitably selecting and using an etching solution that can etch the semiconductor substrate 51 but cannot etch the etching stopping layer 53 and an etching solution that can etch the etching stopping layer 53 but cannot etch the structural body of layers LS, the semiconductor substrate 51 can be removed and thereafter just the etching stopping layer 53 can be removed. The semiconductor substrate 51 can thereby be removed definitely and readily while leaving the structural body of layers LS.

The method of manufacturing the semiconductor photodetector PD1 includes the step, carried out after the step of forming the etching stopping layer 53, of forming the protective film 54 so as to be positioned between the etching stopping layer 53 and the structural body of layers LS. The contamination of the structural body of layers LS (the laminated high-concentration carrier layer 3, light absorbing layer 5, and cap layer 7) by the etching solutions can thereby be prevented definitely.

Second Embodiment

Figure 13:
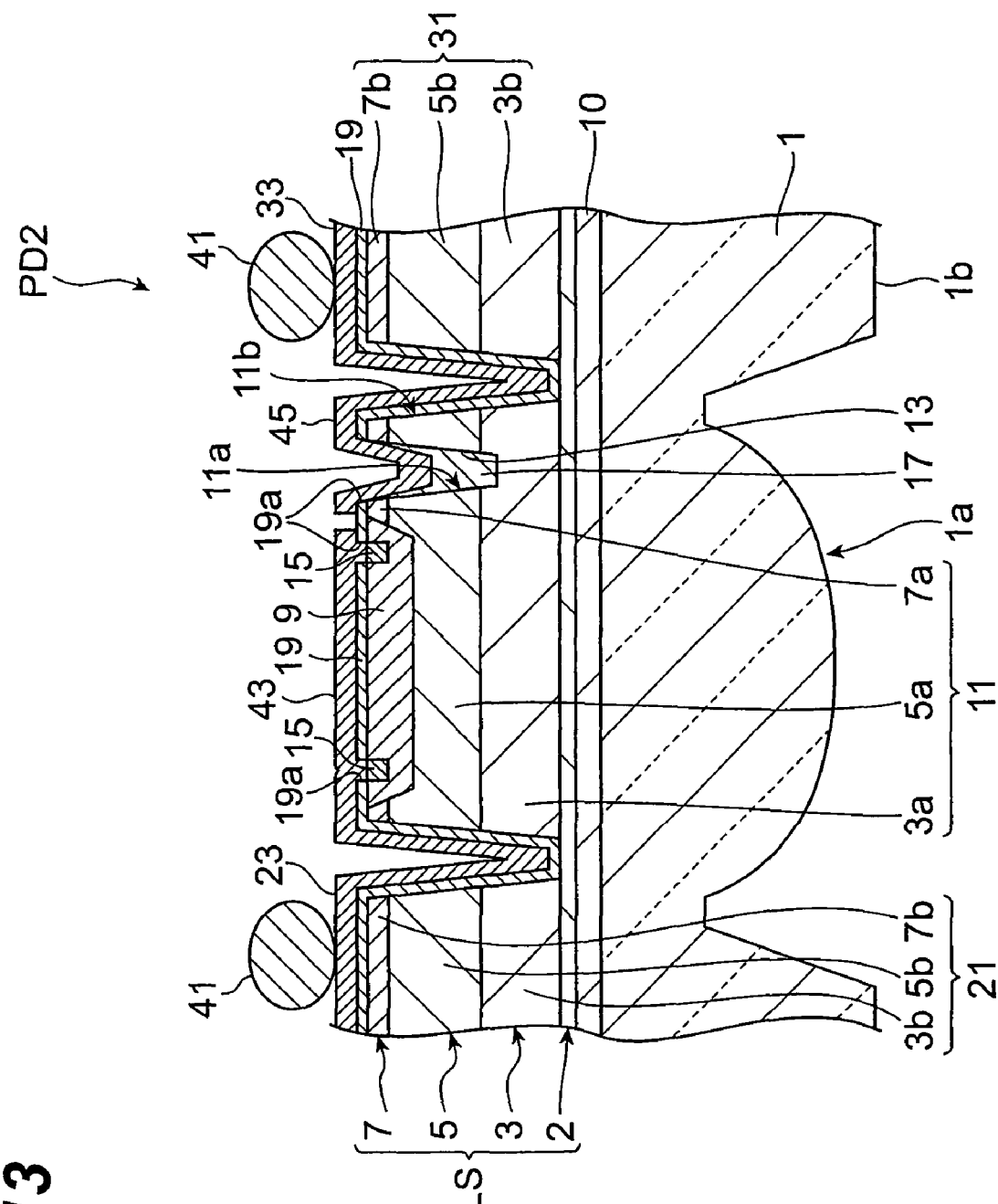
FIG. 13 is a diagram for explaining a sectional structure of a second embodiment of a semiconductor photodetector according to the present invention.

FIG. 13 is a diagram for explaining a sectional structure of a second embodiment of a semiconductor photodetector according to the present invention. The semiconductor photodetector PD2 according to this second embodiment differs from the semiconductor photodetector PD1 according to the first embodiment in that a lens portion 1a is formed on the glass substrate 1.

The semiconductor photodetector PD2 comprises the structural body of layers LS and the glass substrate 1. The semiconductor photodetector PD2 is a back-illuminated semiconductor photodetector, with which light is made incident on the structural body of layers LS from the glass substrate 1 side. Also, the semiconductor photodetector PD2 is, for example, a short-range optical communication photodetector for a wavelength band of 0.85 μm.

The lens portion 1a, which condenses the incident light, is formed on the glass substrate 1. This lens portion 1a is formed so as to be recessed with respect to an outermost surface 1b of the glass substrate 1.

Figure 14:
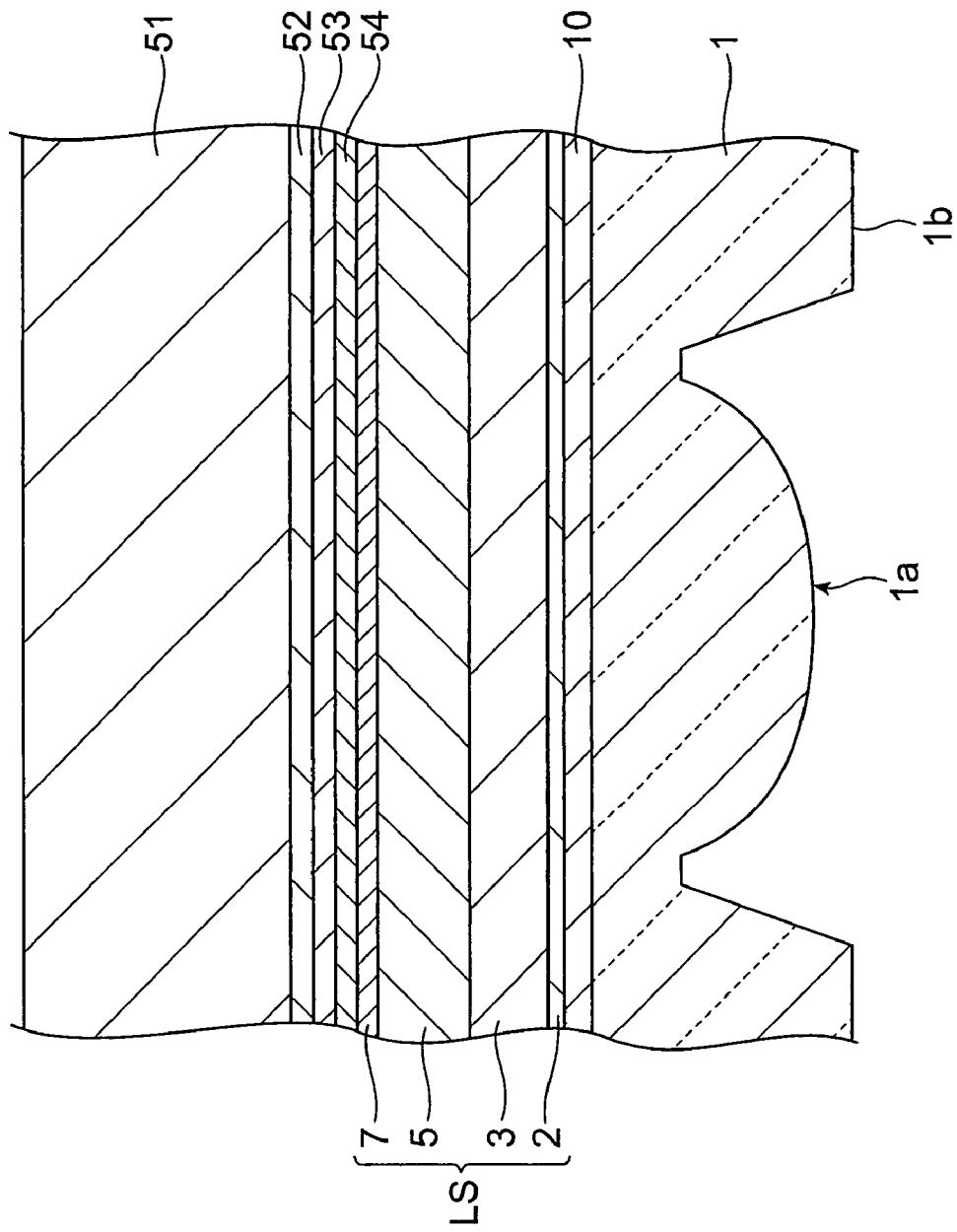
FIG. 14 is a sectional view for explaining a manufacturing step of the second embodiment of the semiconductor photodetector according to the present invention (Part 1)
Figure 15:
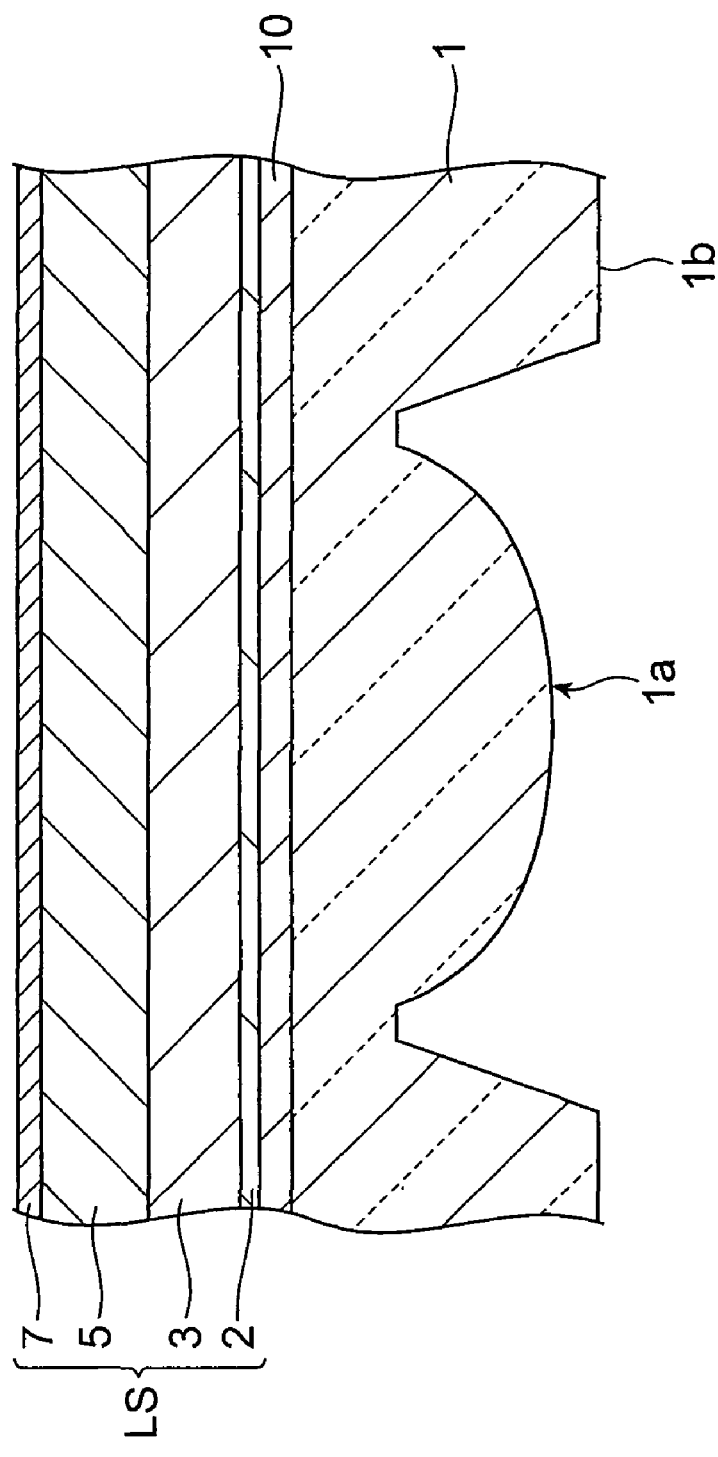
FIG. 15 is a sectional view for explaining a manufacturing step of the second embodiment of the semiconductor photodetector according to the present invention (Part 2)
Figure 16:
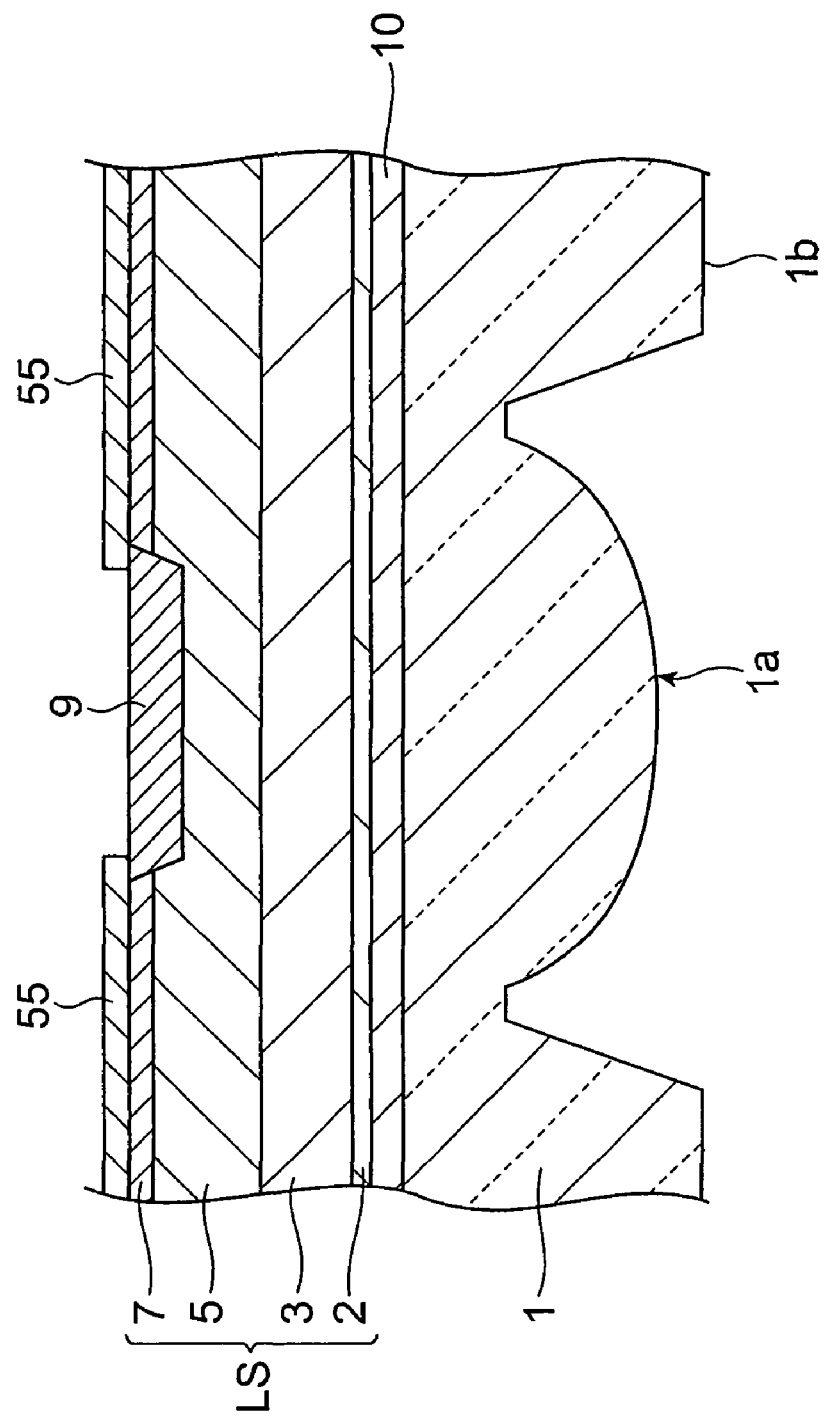
FIG. 16 is a sectional view for explaining a manufacturing step of the second embodiment of the semiconductor photodetector according to the present invention (Part 3)

A method of manufacturing the semiconductor photodetector PD2 of the above-described arrangement will now be explained with reference to FIGS. 14 to 16. FIGS. 14 to 16 are explanatory diagrams for explaining the method of manufacturing the semiconductor photodetector according to the second embodiment and show longitudinal sectional structures of the photodetector.

In this manufacturing method, the following first to thirteenth steps are executed successively. First, the first to third steps of the second embodiment are the same as the first to third step of the first embodiment described above and description thereof shall be omitted.

(Fourth Step)

In the fourth step, the semiconductor substrate 51, on which the structural body of layers LS and the films 52 to 54 and 10 have been formed, and the glass substrate 1 are adhered together (see FIG. 14). First, the glass substrate 1, having the lens portion 1a formed thereon, is prepared and one surface (top surface) of the glass substrate 1 is cleaned. The glass substrate 1 and the semiconductor substrate 51 are then overlapped so that the cleaned top surface of the glass substrate 1 and the outermost surface film 10 of the semiconductor substrate 51 contact each other. Pressurization and heating are then performed in this overlapped state to adhere the substrates 51 and 1 by fusing. The method of adhering the semiconductor substrate 51 and the glass substrate 1 together is the same as the adhesion method of the fourth step of the first embodiment.

(Fifth and Sixth Steps)

In the fifth and sixth steps, the semiconductor substrate 51, the buffer layer 52, the etching stopping layer 53, and the protective layer 54 are removed (see FIG. 15). The methods of removing the semiconductor substrate 51, the buffer layer 52, the etching stopping layer 53, and the protective layer 54 are the same as the removal methods of the fifth and sixth steps of the first embodiment.

(Seventh Step)

In the seventh step, a film 55, comprised of $SiO_2$ or $SiN_x$ is formed on the cap layer 7 and a part of the film 55 present at a position at which the photosensitive region 9 is scheduled to be formed is patterned and opened (see FIG. 16). In this process, by providing a marker on the top surface side of the glass substrate 1 and using a double-side exposure device, the lens portion 1a can be matched readily to the position at which the photosensitive region 9 is scheduled to be formed using the provided marker as a reference. In place of providing a marker, the outer shape of the lens portion 1a may be used as the marker.

Thereafter, using the patterned film 55 on the cap layer 7 as a mask, an impurity (for example, Zn) is thermally diffused and a part of the cap layer 7 is inverted to p-type. The photosensitive region 9 is thereby formed (see FIG. 16). The film 55 is then removed by buffered hydrofluoric acid (BHF).

The eighth to thirteenth steps of the second embodiment are the same as the eighth to thirteenth steps of the first embodiment described above and description thereof shall be omitted. By these first to thirteenth steps, the semiconductor photodetector PD2 of the arrangement shown in FIG. 13 is completed.

As described above, in the second embodiment, the mechanical strength of the structural body of layers LS (the laminated high-concentration carrier layer 3, light absorbing layer 5, and cap layer 7) is maintained by the glass substrate 1 as with the first embodiment, and the semiconductor photodetector PD2 can thus be made compact readily.

In semiconductor photodetector PD2 according to the second embodiment, the lens portion 1a is formed on the glass substrate 1. Thus, even when the photosensitive region 9 is small compared to the illumination range of the incident light, the incident light can be collected efficiently. Consequently, the semiconductor photodetector PD2 of excellent SN ratio and high reliability can be obtained.

Also, in the second embodiment, the lens portion 1a is formed so as to be recessed with respect to the outermost surface 1b of the glass substrate 1. The glass substrate 1, having the lens portion 1a formed thereon, can thus be adhered readily. Also, since the lens portion 1a is processed prior to adhesion, restrictions are not placed in the processing method, etc., and the degree of freedom of design of the lens shape, etc., is increased.

The lens portion 1a may be formed after adhering the semiconductor substrate 51, on which the structural body of layers LS and the films 52 to 54 and 10 have been formed, to the glass substrate 1. However, in consideration of the degree of freedom of design of the lens shape, etc., the glass substrate 1, having the lens portion 1a formed thereon in advance, is preferably adhered to the semiconductor substrate 51.

Figure 17:
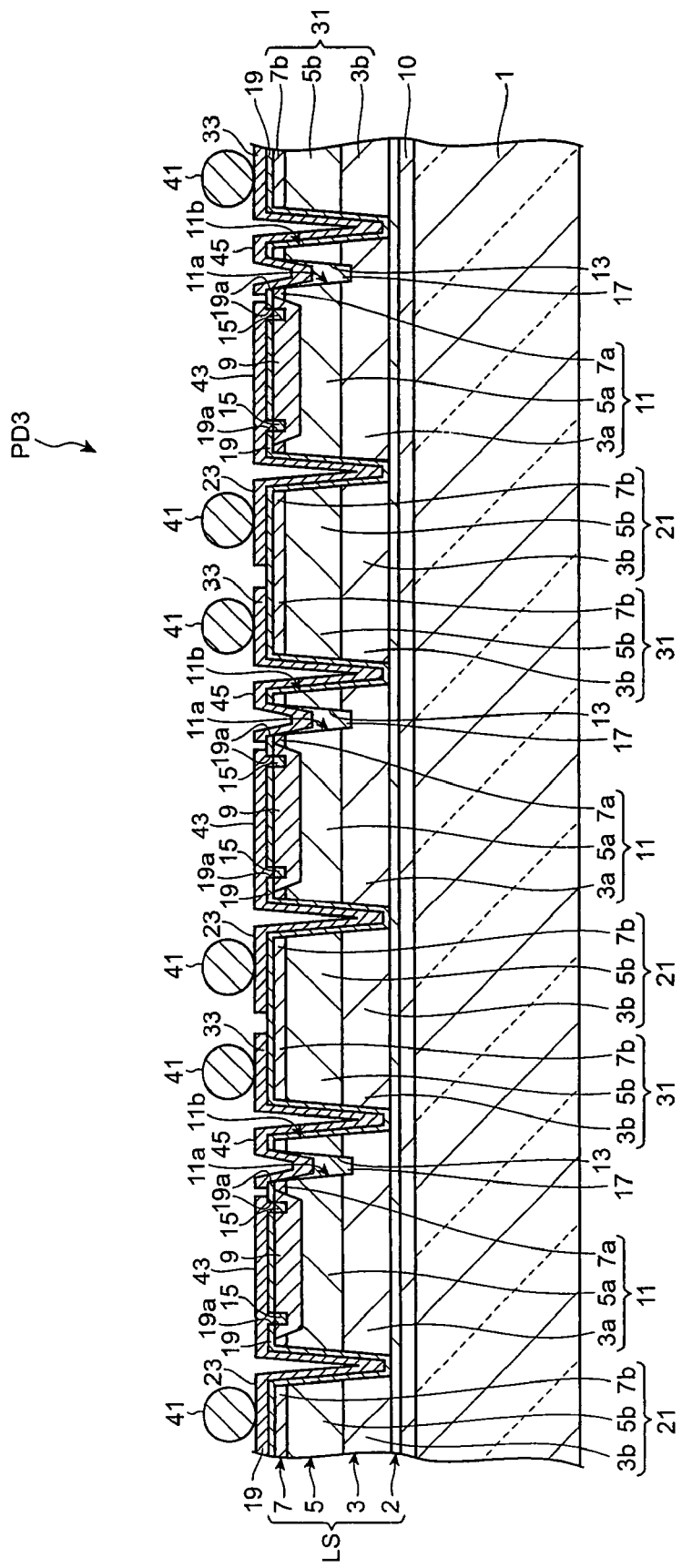
FIG. 17 is a diagram for explaining a sectional structure of a third embodiment (array structure) of a semiconductor photodetector according to the present invention.
Figure 18:
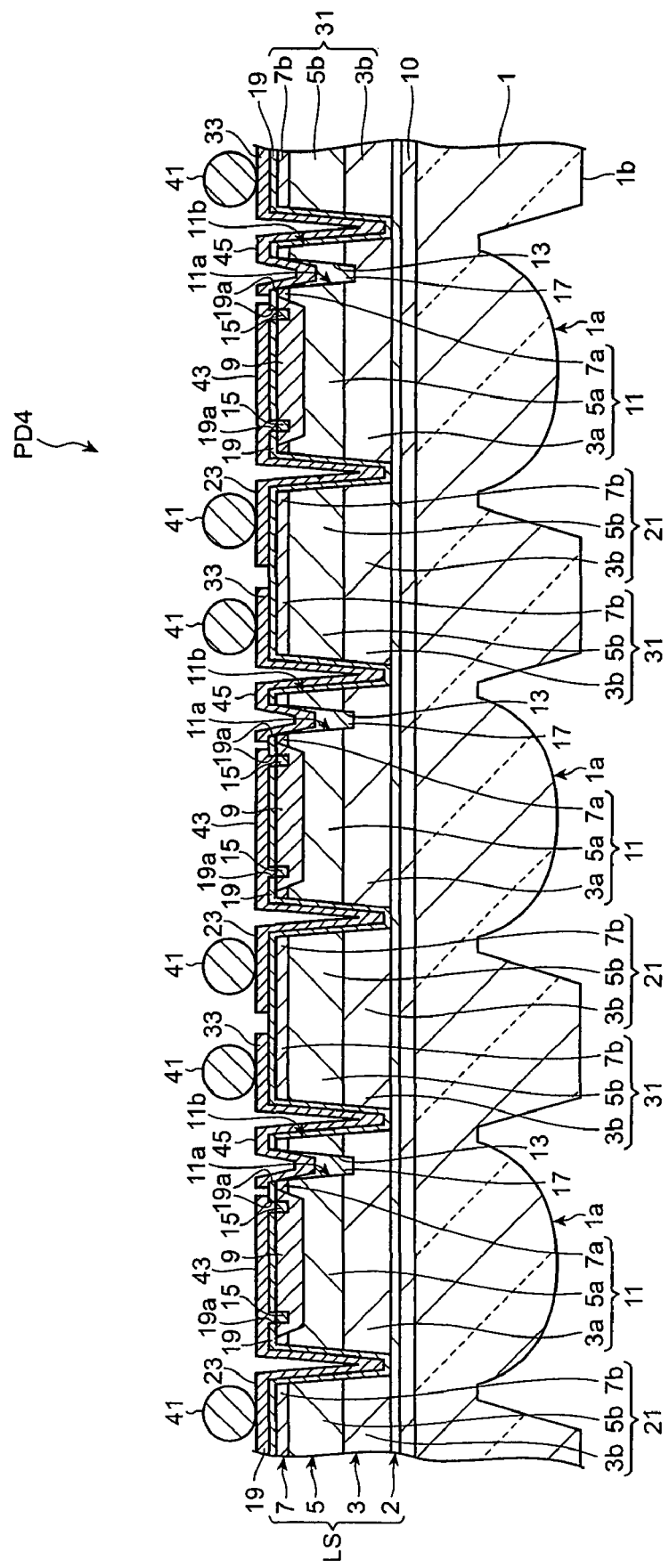
FIG. 18 is a diagram for explaining a sectional structure of a fourth embodiment (array structure) of a semiconductor photodetector according to the present invention.

As third and fourth embodiments of the semiconductor photodetectors according to the present invention, the semiconductor photodetector arrays PD3 and PD4, in each of which a plurality of photosensitive portions 11 are arrayed, shall now be described based on FIGS. 17 and 18. FIG. 17 is a diagram for explaining a sectional structure of the third embodiment (array structure) of the semiconductor photodetector according to the present invention, and FIG. 18 is a diagram for explaining a sectional structure of the fourth embodiment (array structure) of the semiconductor photodetector according to the present invention. The semiconductor photodetector arrays PD3 and PD4 according to these third and fourth embodiments are so-called back-illuminated semiconductor photodetector arrays.

As shown respectively in FIGS. 17 and 18, with each of the semiconductor photodetector arrays PD3 and PD4, the plurality of photosensitive portions 11 are aligned in array form in a direction of one dimension or in directions of two dimensions. In each of semiconductor photodetector arrays PD3 and PD4, a first pad electrode positioning portion 21 and a second pad electrode positioning portion 31 respectively corresponding to adjacent to the photosensitive portions 11 are integrated and shaped to a mesa form. The second pad electrodes 33 are electrically connected to each other.

In each of the semiconductor photodetector arrays PD3 and PD4, the mechanical strengths of the structural bodies of layers LS (the laminated high-concentration carrier layers 3, light absorbing layers 5, and cap layers 7) are maintained by the glass substrate 1 as with the above-described first and second embodiments. The pitch of the photosensitive portions 11 (photosensitive regions 9) can be made narrow and the semiconductor photodetector arrays PD3 and PD4 can thus be made compact readily.

Figure 19:
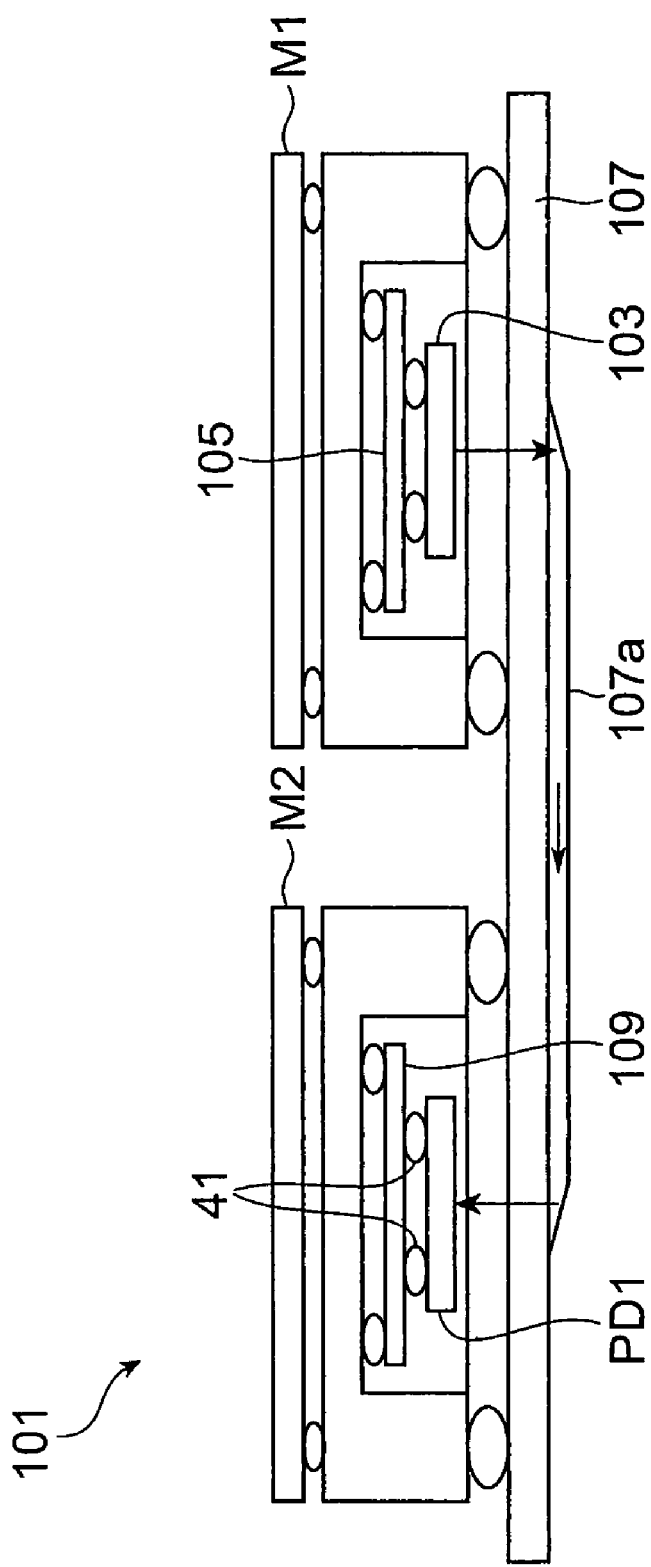
FIG. 19 is a diagram of a general arrangement of an optical interconnection system to which the semiconductor device according to the present invention can be applied.

An optical interconnection system that uses the semiconductor photodetector (semiconductor photodetector array) of the above-described embodiment will now be explained with reference to FIG. 19. FIG. 19 is a diagram of a general arrangement of the optical interconnection system to which the semiconductor photodetector according to the present invention can be applied.

The optical interconnection system 101 is a system that transmits signals in the form of light among a plurality of modules (such as CPUs, integrated circuit chips, memories, etc.) M1 and M2, and includes a semiconductor light emitting devices 103, a driving circuits 105, an optical waveguide substrates 107, a semiconductor photodetectors PD1, amplifying circuits 109, etc. The semiconductor light emitting device 103 may use a back-emitting type, vertical cavity surface emitting laser (VCSEL). The module M1 is electrically connected to the driving circuit 105 through bump electrodes, etc. The semiconductor light emitting device 103 is electrically connected to the driving circuit 105 through the bump electrodes. The semiconductor photodetector PD1 is electrically connected to the amplifying circuit 109 through the bump electrodes 41. The amplifying circuit 109 and module M2 are electrically connected via the bump electrodes, etc.

An electrical signal output from module M1 is sent to the driving circuit 105 and output upon being converted to an optical signal at the semiconductor light emitting device 103. The optical signal, outputted from the semiconductor light emitting device 103, passes through an optical waveguide 107a of the optical waveguide substrate 107 and is inputted into the semiconductor photodetector PD1. The optical signal, inputted into the semiconductor photodetector PD1, is converted into an electrical signal and then sent to and amplified by the amplifying circuit 109. The amplified electrical signal is sent to the module M2. The electrical signal outputted from the module M1 is thus transmitted to the module M2.

In place of the semiconductor photodetectors PD1, the semiconductor photodetectors PD2 or the semiconductor photodetector arrays PD3 or PD4 may be used. In a case where the semiconductor photodetector arrays PD3 or PD4 are used, the semiconductor light emitting devices 103, the driving circuits 105, the optical waveguide substrates 107, and the amplifying circuits 109 are also arranged as arrays.

The present invention is not limited to the above-described embodiments. For example, the thickness, the materials used, etc., of the semiconductor substrate 51, the high-concentration carrier layer 3 (3a, 3b), the light absorbing layer 5 (5a, 5b), the cap layer 7 (7a, 7b), etc., are not limited to those described above. In particular, Si, InP, InGaAs, InSb, or InAsSb may be used in place of the GaAs as the material of the semiconductor substrate 51.

The shape of the depression 13 is not limited to the above-described groove-like form that surrounds the photosensitive region and may be formed to any shape as long as it has a depth that reaches the high-concentration carrier layer 3a. Needless to say, the depression 13 does not have to be formed.

Though in the embodiments, the first pad electrode 23 and the first wiring electrode 43 are formed integrally, and the second pad electrode 33 and the second wiring electrode 45 are formed integrally, the present invention is not limited thereto and these electrodes may instead be formed as respectively separate entities.

In accordance with the semiconductor photodetector manufacturing methods according to the present invention, the photosensitive portion 11, the first pad electrode positioning portion 21, and the second pad electrode positioning portion 31 are separated after forming the depression 13, the depression 13 may instead be formed after separating the photosensitive portion 11, the first pad electrode positioning portion 21, and the second pad electrode positioning portion 31.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The semiconductor device according to the present invention can be applied to an optical interconnection art, etc., of transmitting signals in the form of light within a system device or among devices.

The invention claimed is:

1. A semiconductor photodetector in which a plurality of compound semiconductor layers are laminated, comprising:
   a structural body of layers including said plurality of compound semiconductor layers;
   a silicon oxide film provided on a light-incident surface side of said structural body of layers; and
   a glass substrate optically transparent to incident light, said glass substrate adhered onto said light-incident surface side of said structural body of layers, through said silicon oxide film, wherein said structural body of layers includes a high-concentration carrier layer of a first conductivity type, a light absorbing layer of the first conductivity type, and a cap layer of the first conductivity type that are laminated in that order from said light-incident surface side as said plurality of compound semiconductor layers, and wherein a photosensitive region of a second conductivity type is formed on at least said cap layer, and wherein said plurality of compound semiconductor layers is constituted by:

a photosensitive portion shaped to a mesa-form, said photosensitive portion including a part of said cap layer that includes a periphery of said photosensitive region, a part of said light absorbing layer adjacent to the part of said cap layer, and a part of said high-concentration carrier layer adjacent to the part of said light absorbing layer;

a first pad electrode positioning portion being adjacent to said photosensitive portion and shaped to a mesa-form, said first pad electrode positioning portion including a part of said cap layer, a part of said light absorbing layer, and a part of said high-concentration carrier layer; and a second pad electrode positioning portion being shaped to a mesa-form and provided so as to sandwich said photosensitive portion together with said first pad electrode positioning portion, said second pad electrode positioning portion including a part of said cap layer, a part of said light absorbing layer, and a part of said high-concentration carrier layer, wherein said photosensitive portion has a depression that reaches from the part of said cap layer to said high-concentration carrier layer, and wherein said semiconductor photodetector further comprises:

a first pad electrode arranged on said first pad electrode positioning portion;

a first wiring electrode electrically connecting said first pad electrode and said photosensitive region, said first wiring electrode having a part formed so as to extend along side surfaces of said photosensitive portion and said first pad electrode positioning portion;

a second pad electrode arranged on said second pad electrode positioning portion; and a second wiring electrode electrically connecting said second pad electrode and said high-concentration carrier layer of said photosensitive portion, said second wiring electrode having a part formed so as to extend along side surfaces of said depression, said photosensitive portion, and said second pad electrode positioning portion.

2. A semiconductor photodetector according to claim 1, wherein said structural body of layers further includes an antireflection film provided between said high-concentration carrier layer and said silicon oxide film.

3. A semiconductor photodetector according to claim 1, further comprising a light reflecting film provided on said cap layer side of said structural body of layers so as to cover said photosensitive region.

4. A semiconductor photodetector according to claim 1, wherein said depression is shaped to a groove-like form so as to surround said photosensitive region.

5. A semiconductor photodetector according to claim 1, further comprising bump electrodes respectively contacting said first pad electrode and said second pad electrode.

6. A semiconductor photodetector according to claim 1, further comprising one or more additional photosensitive sections each having the same structure as said photosensitive portion, said photosensitive sections being aligned in array form.

7. A semiconductor photodetector according to claim 1, wherein a lens portion that condenses the incident light is formed on said glass substrate.

8. A semiconductor photodetector according to claim 7, wherein said lens portion is formed more towards said structural body of layers side than an outermost surface at an opposite side of the glass substrate surface that faces said structural body of layers.

* * * * *